United States Patent
Kim et al.

(10) Patent No.: US 12,237,047 B2
(45) Date of Patent: Feb. 25, 2025

(54) METHOD OF READING DATA FROM SELF-SELECTING MEMORY, SELF-SELECTING MEMORY PERFORMING THE SAME AND METHOD OF OPERATING SELF-SELECTING MEMORY USING THE SAME

(71) Applicant: SAMSUNG ELECTRONICS CO., LTD., Suwon-si (KR)

(72) Inventors: Hwan Kim, Suwon-si (KR); Suhee Jeon, Suwon-si (KR); Seulji Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 161 days.

(21) Appl. No.: 18/303,937

(22) Filed: Apr. 20, 2023

(65) Prior Publication Data
US 2024/0112709 A1  Apr. 4, 2024

(30) Foreign Application Priority Data
Sep. 30, 2022 (KR) .................. 10-2022-0125050

(51) Int. Cl.
*G11C 7/10* (2006.01)
(52) U.S. Cl.
CPC .......... *G11C 7/1096* (2013.01); *G11C 7/1066* (2013.01); *G11C 7/1069* (2013.01)
(58) Field of Classification Search
CPC .... G11C 7/1096; G11C 7/1066; G11C 7/1069
USPC ................................. 365/189.011
See application file for complete search history.

(56) References Cited

U.S. PATENT DOCUMENTS

| | | |
|---|---|---|
| 7,471,557 B2 | 12/2008 | Johnson |
| 7,589,343 B2 | 9/2009 | Lowrey |
| 8,867,266 B2 | 10/2014 | Bessho et al. |
| 9,613,691 B2 | 4/2017 | Mantegazza et al. |
| 10,622,063 B2 | 4/2020 | Grobis et al. |
| 10,998,497 B2 | 5/2021 | Tsukamoto |
| 11,152,064 B2 | 10/2021 | Wu et al. |
| 11,217,308 B1 | 1/2022 | Robustelli et al. |
| 11,217,322 B2 | 1/2022 | Tortorelli et al. |
| 2007/0165320 A1* | 7/2007 | Benakli .............. G11B 5/02 360/68 |
| 2014/0301137 A1 | 10/2014 | Kim et al. |
| 2016/0072059 A1 | 3/2016 | Kim et al. |
| 2018/0122472 A1* | 5/2018 | Pirovano ........... G11C 13/0026 |
| 2021/0407592 A1 | 12/2021 | Sforzin et al. |

\* cited by examiner

*Primary Examiner* — Ly D Pham
(74) *Attorney, Agent, or Firm* — F. CHAU & ASSOCIATES, LLC

(57) ABSTRACT

A method of reading data from a self-selecting memory includes generating a read pulse that has a polarity opposite to that of a write pulse. The write pulse writes data into a target memory cell in the self-selecting memory. The read pulse is applied to the target memory cell. The read pulse has a first edge that is a starting point of the read pulse and a second edge that is an ending point of the read pulse. A slope of the second edge of the read pulse is adjusted such that an undershoot or overshoot on the second edge of the read pulse increases.

20 Claims, 25 Drawing Sheets

MCxy

METHOD OF READING DATA FROM SELF-SELECTING MEMORY, SELF-SELECTING MEMORY PERFORMING THE SAME AND METHOD OF OPERATING SELF-SELECTING MEMORY USING THE SAME

CROSS-REFERENCE TO RELATED APPLICATION

This application claims priority under 35 USC § 119 from Korean Patent Application No. 10-2022-0125050, filed on Sep. 30, 2022 in the Korean Intellectual Property Office (KIPO), the contents of which are herein incorporated by reference in their entirety.

TECHNICAL FIELD

Embodiments are directed generally to semiconductor integrated circuits, and more particularly to methods of reading data from self-selecting memories, self-selecting memories that perform the methods of reading data, and methods of operating self-selecting memories using the methods of reading data.

DISCUSSION OF THE RELATED ART

Memory devices are widely used to store information in various electronic devices such as computers, wireless communication devices, cameras, digital displays, ETC. Information is stored by programing different states of a memory device. For example, binary devices have two states, often denoted by a logic "1" or a logic "0." In other systems, more than two states may be supported. To access the stored information, a component of the electronic device reads, or senses, the stored state in the memory device. To store information, a component of the electronic device writes, or programs, the state in the memory device.

Multiple types of memory devices exist, including dynamic random access memory (DRAM), flash memory, magnetic random access memory (MRAM), resistive random access memory (RRAM), phase change memory (PCM), and others. Such memory devices may be volatile or nonvolatile. Some types of memory devices use variations in resistance or voltage drops across a cell to program and sense different logic states. For example, a self-selecting memory enhances differences in a threshold voltage of the memory cell between different programmed states. The method by which a cell is programmed can affect the distribution of various materials that compose the cell, which can affect the ion migration in the cell, which, in turn, can affect a threshold voltage of the cell. A self-selecting memory cell is made of a memory material that changes threshold voltages based on the polarity of the voltage applied across it. A self-selecting memory includes a single material that combines the characteristics of a memory and a switch and may has a simple structure and high degree of integration. Thus, self-selecting memories have been studied as a next-generation memory due to their low operating current and high operating speed.

Read disturbance is a well-known phenomenon in NAND flash memory, where reading data from a flash cell changes the threshold voltages of other (unread) cells in the same block. To resolve the read disturbance effect in a self-selecting memory, a method of recovering a memory cell using a recovery pulse that has a polarity opposite to that of the read pulse has been conventionally used. However, in a conventional method, both the data write operation and the data read operation should be implemented with double polarities or bi-directional polarity, both the write driver and the read driver should be implemented with bi-directional voltage application, and which increases design complexity and chip size. Further, when bi-directional read pulses are applied, the threshold voltage increases due to the acceleration of bias drift, which reduces the read window. Therefore, the polarity of the read pulse of the self-selecting memory should be fixed or maintained to only single polarity.

SUMMARY

At least one embodiment of the present disclosure provides a method of reading data from a self-selecting memory that can efficiently reduce the read disturbance effect.

At least one embodiment of the present disclosure provides a self-selecting memory that performs a method of reading data.

At least one embodiment of the present disclosure provides a method of operating a self-selecting memory that uses a method of reading data.

According to embodiments, a method of reading data from a self-selecting memory includes generating a read pulse that having a polarity opposite to that of a write pulse is generated. The write pulse writes data into a target memory cell in the self-selecting memory. The read pulse has a first edge that is a starting point of the read pulse and a second edge that is an ending point of the read pulse. A slope of the second edge of the read pulse is adjusted such that an undershoot or overshoot on the second edge of the read pulse increases. The read pulse is applied to the target memory cell.

According to embodiments, a self-selecting memory includes a self-selecting memory cell array and a write/read circuit. The self-selecting memory cell array includes a plurality of self-selecting memory cells. The write/read circuit controls a data write operation and a data read operation on the self-selecting memory cell array. In the data read operation on a target memory cell in the self-selecting memory cell array, the write/read circuit generates a read pulse that has a polarity opposite to that of a write pulse, and applies the read pulse to the target memory cell. The write pulse writes data into the target memory cell. The read pulse has a first edge that is a starting point of the read pulse and a second edge that is an ending point of the read pulse. A slope of the second edge of the read pulse is adjusted such that an undershoot or overshoot on the second edge of the read pulse increases.

According to embodiments, a method of operating a self-selecting memory includes performing a data write operation on a target memory cell in the self-selecting memory by using a write pulse that has a first polarity, and performing a data read operation on the target memory cell using a read pulse that has a second polarity opposite to the first polarity. Performing the data read operation includes generating the read pulse and applying the read pulse to the target memory cell. Generating the read pulse includes adjusting a slope of a first edge of the read pulse by increasing a transition time of the first edge of the read pulse such that an overshoot or undershoot on the first edge decreases, and adjusting a slope of a second edge of the read pulse by decreasing a transition time of the second edge of the read pulse such that an undershoot or overshoot on the second edge increases. The first edge is a starting point of the read pulse. The second edge is an ending point of the read pulse. The method further includes adjusting the slope of the second edge of the read pulse such that the transition time of the second edge of the read pulse becomes shorter as a distance between a write/read circuit that generates the read pulse and the target memory cell increases. In response to the slopes of the first and second edges of the read pulse being adjusted, the transition times of the first and second edges of the read pulse become different from each other.

In a method of reading data from a self-selecting memory, the self-selecting memory, and a method of operating the self-selecting memory according to embodiments, the slope of the second edge of the read pulse is adjusted to increase the undershoot or overshoot on the second edge of the read pulse, and thus a recovery effect, which is the same as or similar to that of directly generating and applying a recovery pulse, can be implemented by modifying the read pulse without directly generating the recovery pulse. In addition, the slope of the first edge of the read pulse is additionally adjusted to decrease the overshoot or undershoot on the first edge of the read pulse, and thus read stress is reduced. Accordingly, a read disturbance effect can be efficiently resolved while preventing an increase in design complexity and chip size.

DETAILED DESCRIPTION OF THE EMBODIMENTS

Figure 1:
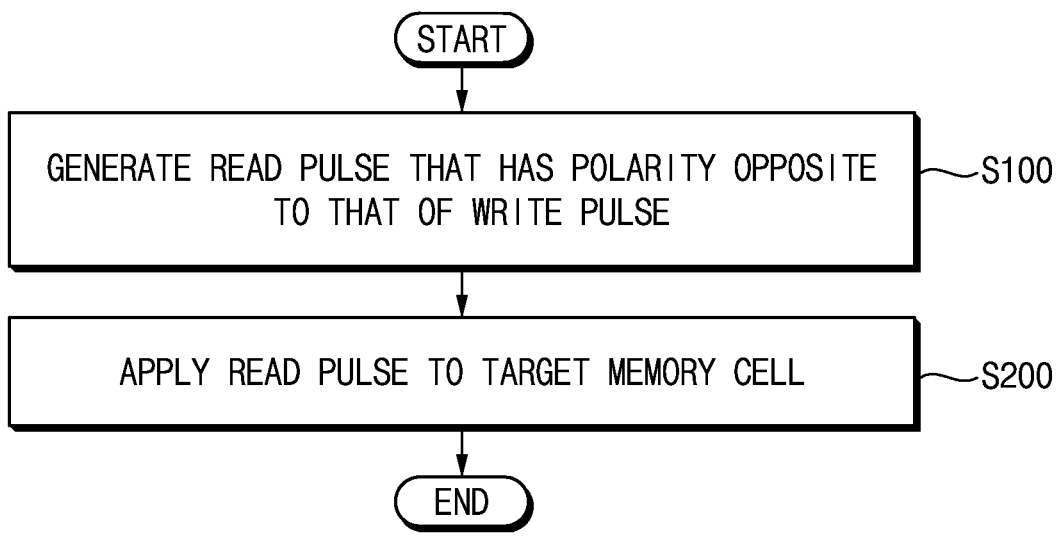
FIG. 1 is a flowchart of a method of reading data from a self-selecting memory according to embodiments.

Various embodiments will be described more fully with reference to the accompanying drawings, in which embodiments are shown. Embodiments of the present disclosure may, however, take many different forms and should not be construed as limited to embodiments set forth herein. Like reference numerals may refer to like elements throughout this application.

FIG. 1 is a flowchart of a method of reading data from a self-selecting memory according to embodiments.

Referring to FIG. 1, a method of reading data from a self-selecting memory according to embodiments is performed by a self-selecting memory that includes a self-selecting memory cell array and a write/read circuit. The self-selecting memory cell array includes a plurality of self-selecting memory cells, and the write/read circuit controls data write operations and data read operations to/from the self-selecting memory cell array. A configuration of the self-selecting memory will be described with reference to FIG. 2.

In a method of reading data from a self-selecting memory according to embodiments, a data read operation is performed on a target memory cell in the self-selecting memory. The data read operation on the target memory cell may be performed after a data write operation on the target memory cell is performed. For example, the target memory cell may be one of the plurality of self-selecting memory cells.

In a data read operation, a read pulse that has a polarity opposite to that of a write pulse is generated (step S100), and the read pulse is applied to the target memory cell (step S200). The write pulse is used to write data into the target memory cell in the data write operation. For example, the write pulse has a first polarity, and the read pulse has a second polarity opposite to the first polarity. For example, the first polarity is one of a positive polarity or a negative polarity, and the second polarity is the other of the positive polarity or the negative polarity. Step S100 will be described with reference to FIGS. 6, 12, 17 and 22.

When steps S100 and S200 are performed, the data read operation is performed on the target memory cell, and the data stored in the target memory cell by the data write operation can be read or retrieved from the target memory cell.

The read pulse has a first edge that represents a starting point (or portion) of the read pulse and a second edge that represents an ending point (or portion) of the read pulse. For example, the first edge is one of a rising edge or a falling edge, and the second edge is the other of the rising edge or the falling edge.

In some embodiments, as will be described with reference to FIG. 6, a slope of the second edge of the read pulse can be adjusted to increase an undershoot or overshoot on the second edge of the read pulse. When the undershoot or overshoot increases on the second edge of the read pulse, the effect is the same as applying a recovery pulse, and thus the read disturbance effect of the self-selecting memory is reduced. An operation of adjusting the slope of the second edge of the read pulse will be described in detail with reference to FIGS. 6 through 16.

In some embodiments, as will be described with reference to FIG. 17, a slope of the first edge of the read pulse can be additionally adjusted decrease an overshoot or undershoot on the first edge of the read pulse. When the overshoot or undershoot decreases on the first edge of the read pulse, the read disturbance effect of the self-selecting memory is reduced. Such operation of adjusting the slope of the first edge of the read pulse will be described in detail with reference to FIGS. 17 through 21.

In some embodiments, when the slopes of the first and second edges of the read pulse are adjusted, the transition times of the first and second edges of the read pulse differ from each other. For example, absolute values of the slopes of the first and second edges of the read pulse differ from each other.

Figure 25:
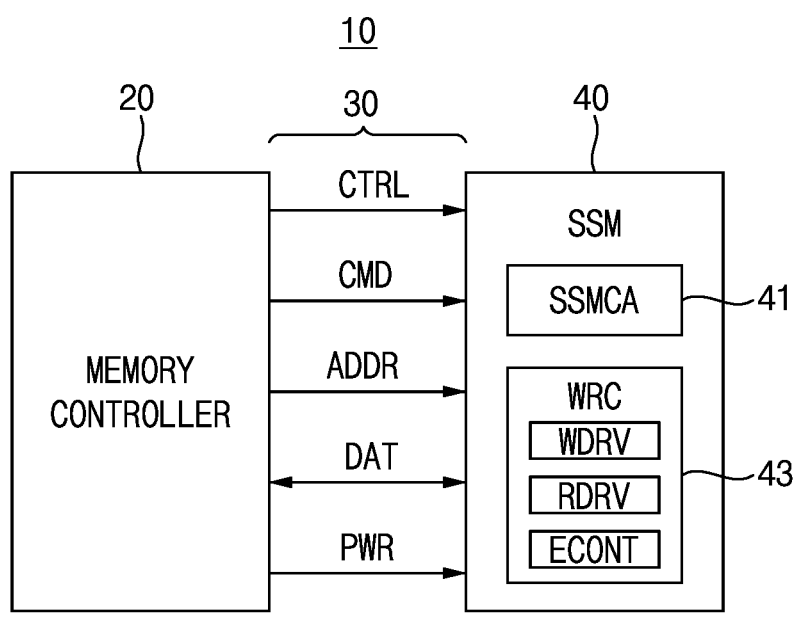
FIG. 25 is a block diagram of a memory system that includes a self-selecting memory according to embodiments.

In some embodiments, steps S100 and S200 are performed based on a read command and a read address that are received from a memory controller, such as a memory controller 20 in FIG. 25 located external to the self-selecting memory. For example, based on the read command and the read address, the target memory cell is specified and the data read operation is performed on the target memory cell.

Figure 2:
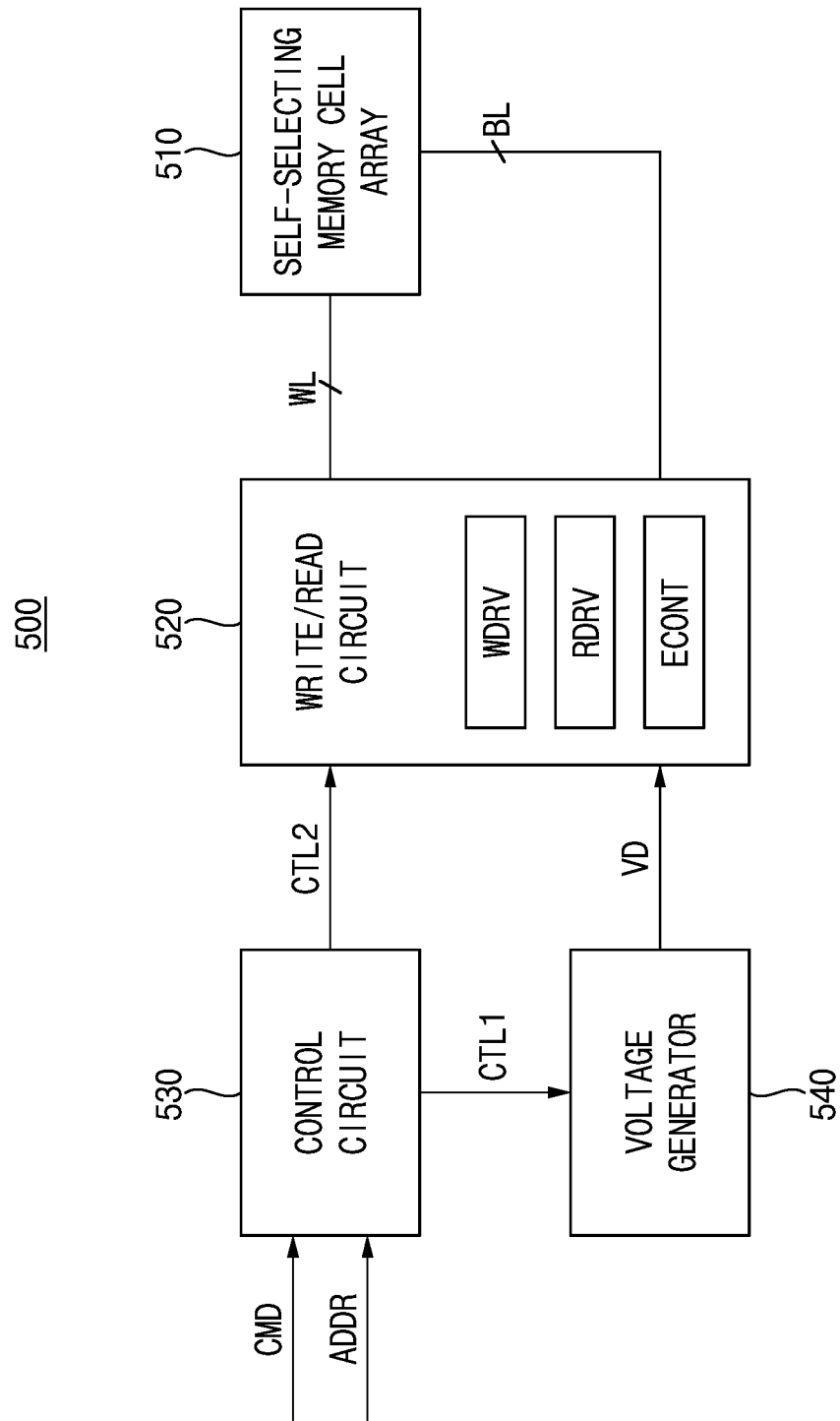
FIG. 2 is a block diagram of a self-selecting memory according to embodiments.

FIG. 2 is a block diagram illustrating a self-selecting memory according to embodiments.

Referring to FIG. 2, in an embodiment, a self-selecting memory 500 includes a self-selecting memory cell array 510, a write/read circuit 520, a control circuit 530 and a voltage generator 540.

The self-selecting memory cell array 510 includes a plurality of self-selecting memory cells that are connected to a plurality of wordlines WL and a plurality of bitlines BL. When voltage signals or current signals are provided through the plurality of wordlines WL and the plurality of bitlines BL, data can be written into or read from selected memory cells, while preventing or reducing the likelihood of writing data into or reading data from the remaining unselected memory cells. Configurations of the self-selecting memory cell array 510 and the self-selecting memory cell will be described with reference to FIGS. 3 and 4.

The control circuit 530 generates control signals CTL1 and CTL2 based on a command CMD and an address ADDR that are received from an external memory controller, such as the memory controller 20 in FIG. 25. For example, the address (or access address) ADDR that represents a target memory cell (or access-target memory cell) is received by the control circuit 530, accompanied by the command CMD. For example, the command CMD may be one of a write command for a data write operation, a read command for a data read operation, etc. For example, the address ADDR includes a row address that selects at least one of the plurality of wordlines WL, and a column address that selects at least one of the plurality of bitlines BL. In addition, the control circuit 530 includes a command decoder that processes the command CMD and an address buffer that processes the address ADDR.

The voltage generator 540 generates a plurality of driving voltages VD based on the control signal CTL1. For example, the plurality of driving voltages VD include a write voltage used in the data write operation, a read voltage used in the data read operation, and inhibit voltages provided to unselected wordlines and unselected bitlines of the data write/read operations, etc.

The write/read circuit 520 is connected to the self-selecting memory cell array 510 through the plurality of wordlines WL and the plurality of bitlines BL, and controls the data write operation and the data read operation of the self-selecting memory cell array 510 based on the control signal CTL2 and the plurality of driving voltages VD. For example, the write/read circuit 520 can write data into or read data from a target memory cell of the plurality of self-selecting memory cells in the self-selecting memory cell array 510.

The write/read circuit 520 includes a write driver WDRV, a read driver RDRV and an edge controller ECONT. The write driver WDRV generates a write pulse used in the data write operation based on a write voltage of the plurality of driving voltages VD. The read driver RDRV generates a read pulse used in the data read operation based on a read voltage of the plurality of driving voltages VD. The edge controller ECONT adjusts a slope of at least one edge of the read pulse.

The write/read circuit 520 performs a method of reading data from the self-selecting memory according to embodiments described with reference to FIG. 1. For example, in a data read operation on a target memory cell, the read driver RDRV of the write/read circuit 520 generates a read pulse that has a polarity opposite to that of a write pulse used to write data into the target memory cell, and applies the read pulse to the target memory cell. The edge controller ECONT of the write/read circuit 520 adjusts a slope of a second edge of the read pulse that increases an undershoot or overshoot of the second edge that represents an end point of the read pulse, and additionally adjusts a slope of a first edge of the read pulse that decreases an overshoot or undershoot on the first edge that represents a starting point of the read pulse.

Figure 3:
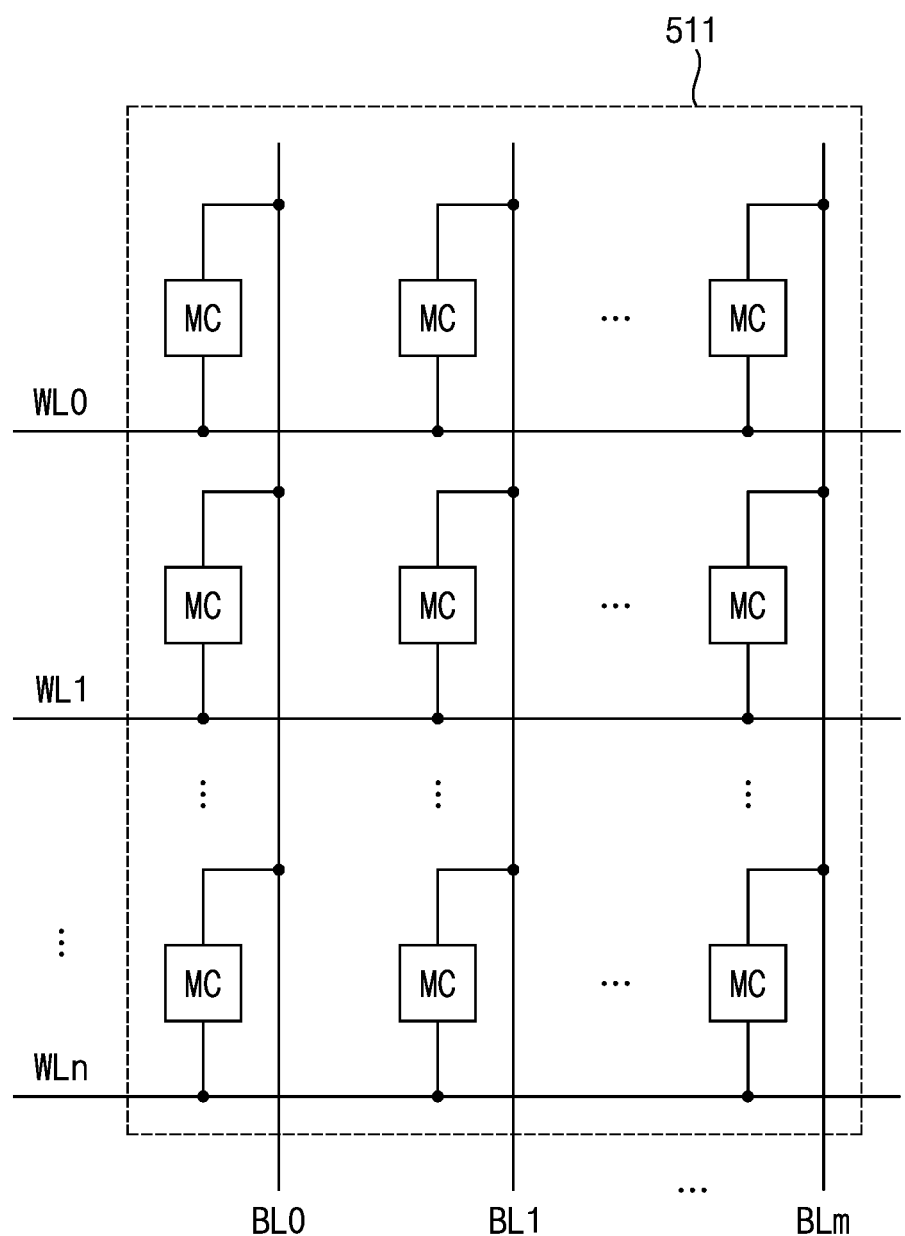
FIG. 3 illustrates a self-selecting memory cell array included in a self-selecting memory of FIG. 2.

FIG. 3 illustrates a self-selecting memory cell array in a self-selecting memory of FIG. 2.

Referring to FIG. 3, in an embodiment, a self-selecting memory cell array 511 includes a plurality of self-selecting memory cells MC disposed in regions where a plurality of wordlines WL0, WL1, . . . , WLn and a plurality of bitlines BL0, BL1, . . . , BLm intersect each other, where n and m is each a positive integer greater than or equal to two.

Each of the plurality of self-selecting memory cells MC is connected between one of the plurality of wordlines WL0 to WLn and one of the plurality of bitlines BL0 to BLm. A voltage applied to each self-selecting memory cell MC corresponds to a voltage difference between the corresponding wordline and bitline.

The plurality of wordlines WL0 to WLn and the plurality of bitlines BL0 to BLm are connected to a write/read circuit, such as the write/read circuit 520 in FIG. 2. A write driver, such as the write driver WDRV in FIG. 2, in the write/read circuit is enabled or activated by receiving a write command, and applies a write pulse (or write current) that performs a data write operation (or program operation) on a self-selecting memory cell connected to a selected wordline and a selected bitline. A read driver, such as the read driver RDRV in FIG. 2, in the write/read circuit is enabled or activated by receiving a read command, and applies a read pulse (or read current) that performs a data read operation on a self-selecting memory cell connected to a selected wordline and a selected bitline.

Figure 4:
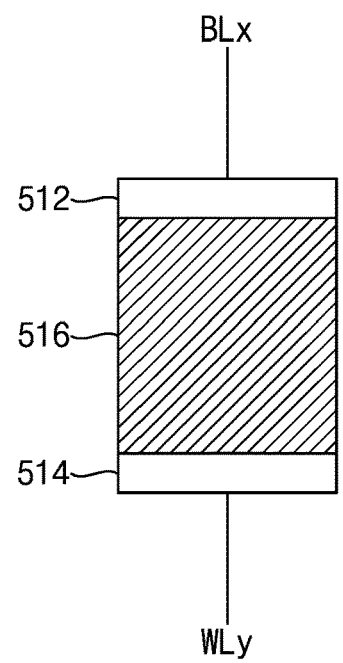
FIG. 4 illustrates a self-selecting memory cell included in a self-selecting memory cell array of FIG. 3.

FIG. 4 illustrates a self-selecting memory cell in a self-selecting memory cell array of FIG. 3.

Referring to FIG. 4, in an embodiment, a self-selecting memory cell MCxy is connected to a bitline BLx and a wordline WLy, where x is a positive integer greater than or equal to zero and less than or equal to m, and where y is a positive integer greater than or equal to zero and less than or equal to n. The self-selecting memory cell MCxy includes a first electrode 512, a second electrode 514 and a self-selecting material 516.

The first electrode 512 is connected to the bitline BLx, the second electrode 514 is connected to the wordline WLy, and the self-selecting material 516 is formed or disposed between the first electrode 512 and the second electrode 514. The self-selecting material 516 combines characteristics of a memory and a switch, and can perform a data storage function and a memory cell selection (or on/off) function at once. For example, the self-selecting material 516 is an ovonic threshold switch (OTS) that maintains a state that represents a specific stored data value at the same time. Thus, the self-selecting memory cell MCxy does not include a separate or additional switching element.

In some embodiments, the self-selecting material 516 includes a chalcogenide material. For example, the chalcogenide material includes a chalcogenide glass such as, an alloy of one or more of sulfur(S), selenium (Se), tellurium (Te), arsenic (As), antimony (Sb), carbon (C) or germanium (Ge). In some embodiments, a chalcogenide material having primarily selenium (Se), arsenic (As) and germanium (Ge) may be referred to as an SAG-alloy. In some embodiments, the SAG-alloy includes silicon (Si), and such chalcogenide material may be referred to as an SiSAG-alloy. In some embodiments, the chalcogenide glass includes additional elements such as hydrogen (H), oxygen (O), nitrogen (N), chlorine (Cl) or fluorine (F), each in atomic or molecular forms.

In some embodiments, chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd or Ge—Te—Sn—Pt. The hyphenated chemical composition notation, as used herein, indicates the elements included in a particular compound or alloy and represents all stoichiometries that include the indicated elements. For example, Ge—Te may include $Ge_pTe_q$, where p and q are each positive integers.

However, the self-selecting material included in a self-selecting memory according to embodiments is not necessarily be limited to the above-described materials.

In some embodiments, the self-selecting memory cell MCxy is formed by a series of layers between the bitline BLx and the wordline WLy, or in other geometric relationships.

FIGS. 5A, 5B, 5C, 5D, 5E, 5F, 5G and 5H illustrate a data write operation and a data read operation on a self-selecting memory according to embodiments.

Figure 5A:
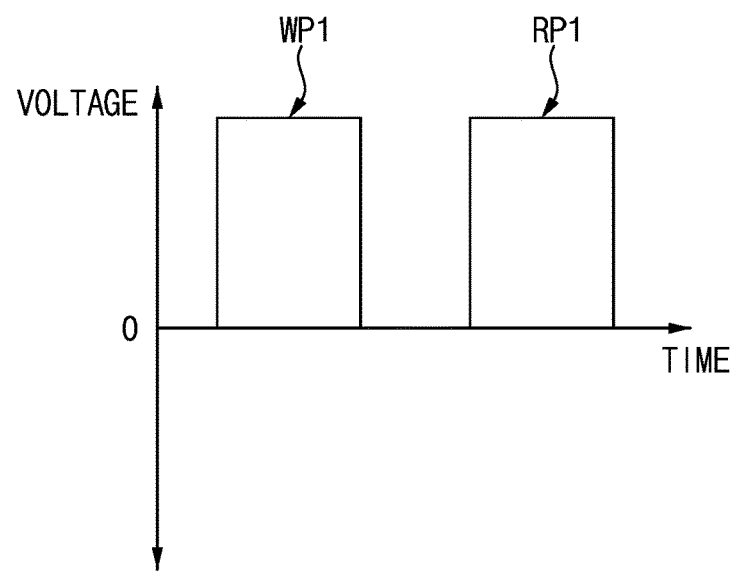
FIGS. 5A, 5B, 5C, 5D, 5E, 5F, 5G and 5H illustrate a data write operation and a data read operation on a self-selecting memory according to embodiments.
Figure 5B:
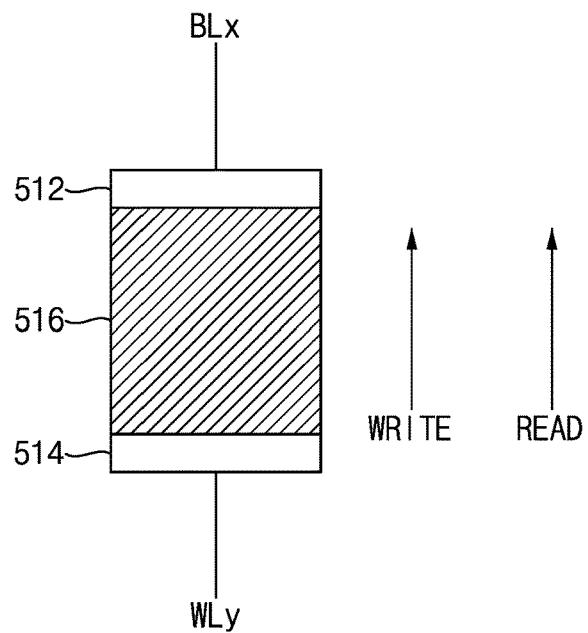

Referring to FIGS. 5A and 5B, in an embodiment, an example is illustrated in which directions of a data write operation and a data read operation are the same as each other. For example, a write pulse WP1 that has a positive polarity is applied in the data write operation, and a read pulse RP1 having a positive polarity is applied in the data read operation. For example, the positive polarity indicates that voltage levels of the write pulse WP1 and the read pulse RP1 are greater than zero. In FIG. 5B, the directions of the data write operation and the data read operation are the directions to which the write pulse WP1 and read pulse RP1 are applied and/or directions of currents caused by the write pulse WP1 and the read pulse RP1.

Figure 5C:
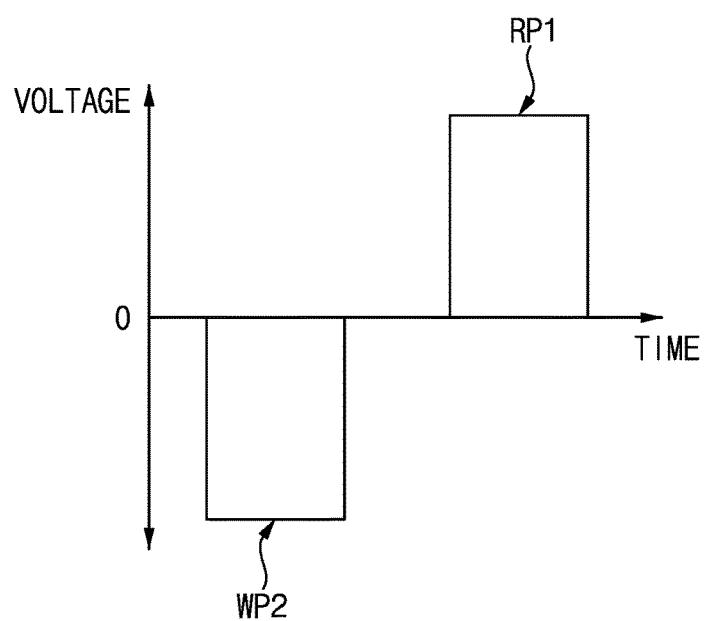
Figure 5D:
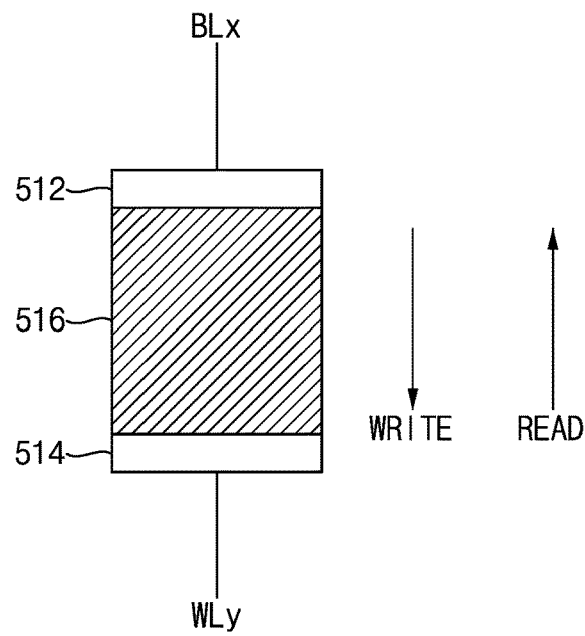

Referring to FIGS. 5C and 5D, in an embodiment, an example is illustrated in which directions of a data write operation and a data read operation differ from, e.g., are opposite to each other. For example, a write pulse WP2 that has a negative polarity is applied in the data write operation, and the read pulse RP1 that has a positive polarity is applied in the data read operation. As compared to the example of FIGS. 5A and 5B, the direction of the data write operation is changed in the example of FIGS. 5C and 5D.

Figure 5E:
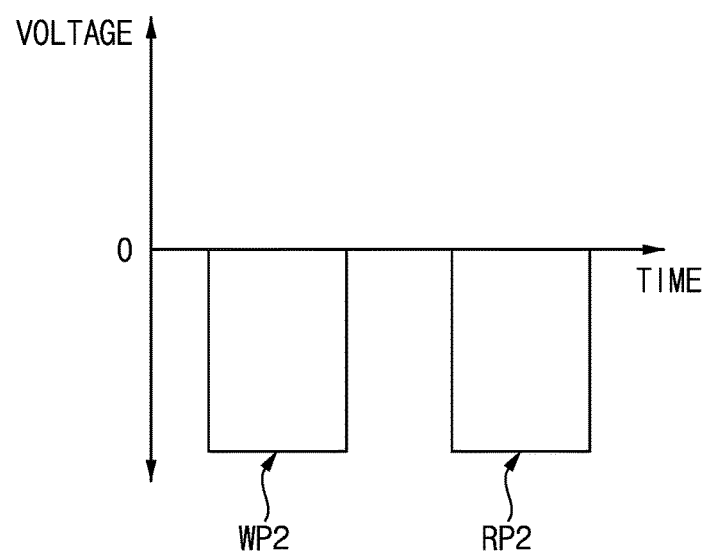
Figure 5F:
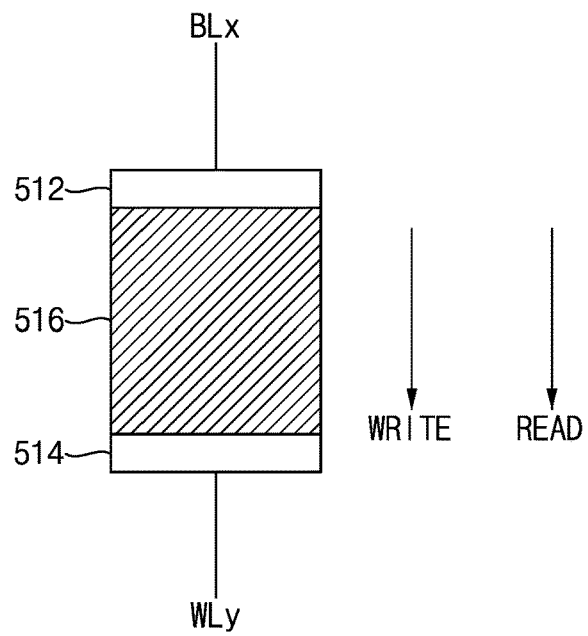

Referring to FIGS. 5E and 5F, in an embodiment, an example is illustrated in which directions of a data write operation and a data read operation are the same as each other. For example, a write pulse WP2 that has a negative polarity is applied in the data write operation, and a read pulse RP2 that has a negative polarity is applied in the data read operation. For example, a negative polarity indicates that voltage levels of the write pulse WP2 and the read pulse RP2 are less than zero. As compared to the example of FIGS. 5A and 5B, the directions of the data write operation and the data read operation are changed in the example of FIGS. 5E and 5F.

Figure 5G:
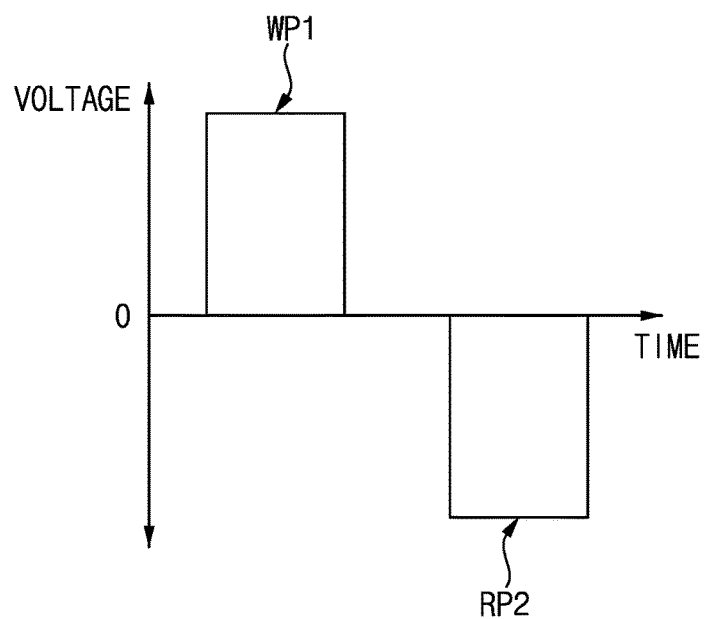
Figure 5H:
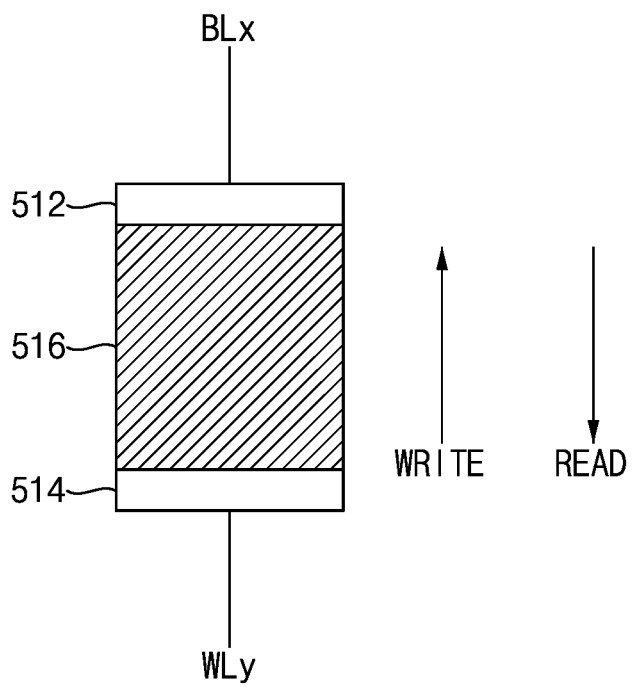

Referring to FIGS. 5G and 5H, in an embodiment, an example is illustrated in which directions of a data write operation and a data read operation differ from each other. For example, a write pulse WP1 that has a positive polarity is applied in the data write operation, and a read pulse RP2 that has a negative polarity is applied in the data read operation. As compared to the example of FIGS. 5E and 5F, the direction of the data write operation are changed in the example of FIGS. 5G and 5H.

In some embodiments, a data write operation is implemented with double polarities or a bi-directional polarity, and a data read operation is implemented with only a single polarity or a uni-directional polarity. For example, the write pulse used in the data write operation has both a positive polarity and a negative polarity, and a read pulse used in the data read operation is fixed to one of a positive polarity or a negative polarity. For example, when the read pulse is implemented with only a positive polarity, the self-selecting memory operates as in the example of FIGS. 5A and 5B or as in the example of FIGS. 5C and 5D. For example, when the read pulse is implemented with only a negative polarity, the self-selecting memory operates as in the example of FIGS. 5E and 5F or as in the example of FIGS. 5G and 5H.

The operating principle of a self-selecting memory is that some of the ions inside the channel move according to the direction of the applied electric field to form an ion concentration gradient inside the self-selecting material, and that the memory window is formed by modulating the threshold voltage according to the ion concentration. For example, when the directions of the data write operation and the data read operation are the same as each other as in the example of FIGS. 5A and 5B and the example of FIGS. 5E and 5F, the memory window is defined by a low threshold voltage state, or a low VTH state, such as the SET state of a conventional phase change memory (PCM). For example, when the directions of the data write operation and the data read operation are different from each other as in the example of FIGS. 5C and 5D and the example of FIGS. 5G and 5H, the memory window is defined by a high threshold voltage state, or a high VTH state, such as the RESET state of the conventional PCM.

As described above, in an embodiment, when the data read operation is implemented with only a single polarity or uni-directional polarity, such as when the polarity of the read pulse is fixed and/or maintained at a single polarity, the read disturbance effect can occur. The read disturbance effect occurs when the directions of the data write operation and the data read operation are opposite to each other, such as in the high threshold voltage state as in the example of FIGS. 5C and 5D and the example of FIGS. 5G and 5H. When a read pulse with a polarity opposite to that of a write pulse is applied during a data read operation, the memory cell has stress in a direction opposite to that of the data write operation, and when stress in the opposite direction accumulates, the high threshold voltage state changes to a low threshold voltage state. For example, as illustrated in FIGS. 5C and 5D, when a data read operation that uses positive polarity read pulse RP1 is repeatedly performed on a memory cell on which the data write operation has been performed using a negative polarity write pulse WP2, the threshold voltage of the memory cell gradually decreases, and thus the state of the memory cell changes to a state on which the data write operation is performed using a positive polarity write pulse WP1. Such read disturbance effects accelerate as the time of applying the read pulse increases and as the voltage level of the read pulse increases.

To resolve the above-described read disturbance effects, a method of recovering a memory cell using a recovery pulse that has a polarity opposite to that of the read pulse has been conventionally used. However, in a conventional method, both the data write operation and the data read operation should be implemented with double polarities or bi-directional polarity, both the write driver and the read driver should be implemented with bi-directional voltage application, which increases design complexity and chip size. Further, when bi-directional read pulses are applied, the threshold voltage increases due to the acceleration of bias drift reduces the read window. Therefore, a self-selecting memory can be designed by fixing and/or maintaining the polarity of the read pulse to only a single polarity.

In a method of reading data from a self-selecting memory and a self-selecting memory according to embodiments, the recovery effect, which is the same as or similar to that of directly generating and applying the recovery pulse, can be implemented by modifying the read pulse without directly generating the recovery pulse. Accordingly, the read disturbance effect can be efficiently resolved while preventing an increase in design complexity and chip size.

Figure 6:
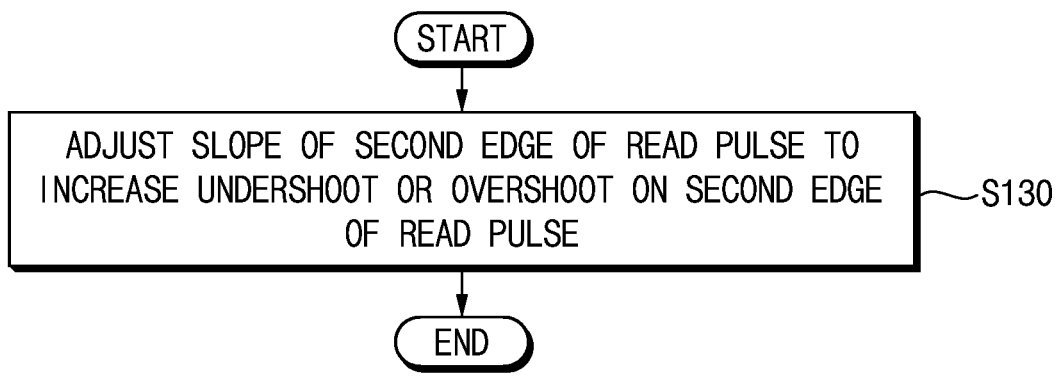
FIG. 6 is a flowchart of generating a read pulse in FIG. 1.

FIG. 6 is a flowchart of generating a read pulse in FIG. 1.

Referring to FIGS. 1 and 6, in an embodiment, when generating a read pulse that has a polarity opposite to that of the write pulse (step S100), the slope of the second edge of the read pulse is adjusted to increase the undershoot or overshoot of the second edge that represents the end point of the read pulse (step S130). For example, the slope of the second edge of the read pulse is adjusted, such as by increasing an absolute value of the slope, that adjusts or decreases a transition time of the second edge of the read pulse.

Figure 7:
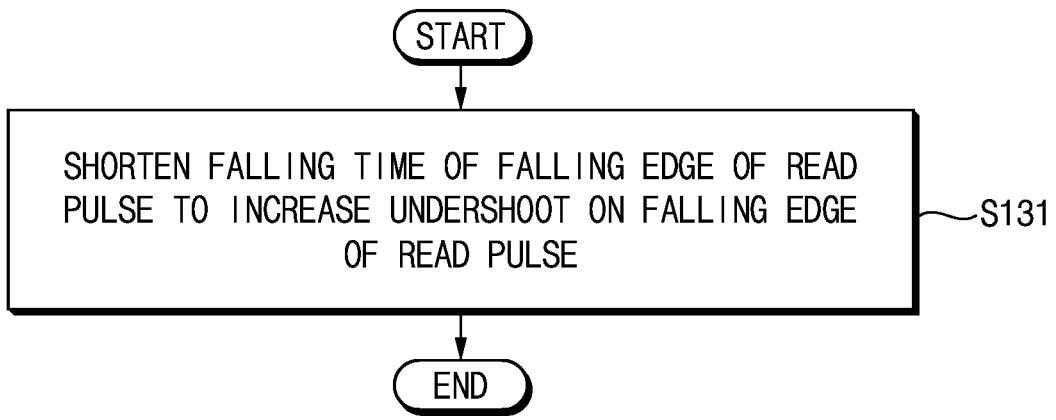
FIG. 7 is a flowchart of adjusting a slope of a second edge of a read pulse in FIG. 6.

FIG. 7 is a flowchart of adjusting a slope of a second edge of a read pulse in FIG. 6. FIGS. 8A, 8B, 8C and 8D illustrate an operation of FIG. 7.

Referring to FIGS. 5C, 5D, 6, 7, 8A, 8B, 8C and 8D, in an embodiment, an example is illustrated of adjusting the slope of the second edge of the read pulse (step S130). For example, when the write pulse WP2 has a negative polarity, the read pulse RP1 has a positive polarity, and the first edge and the second edge of the read pulse RP1 are a rising edge and a falling edge, respectively. In step S130, a falling time of the falling edge of the read pulse RP1 is shortened to increase an undershoot on the falling edge of the read pulse RP1 (step S131).

Figure 8A:
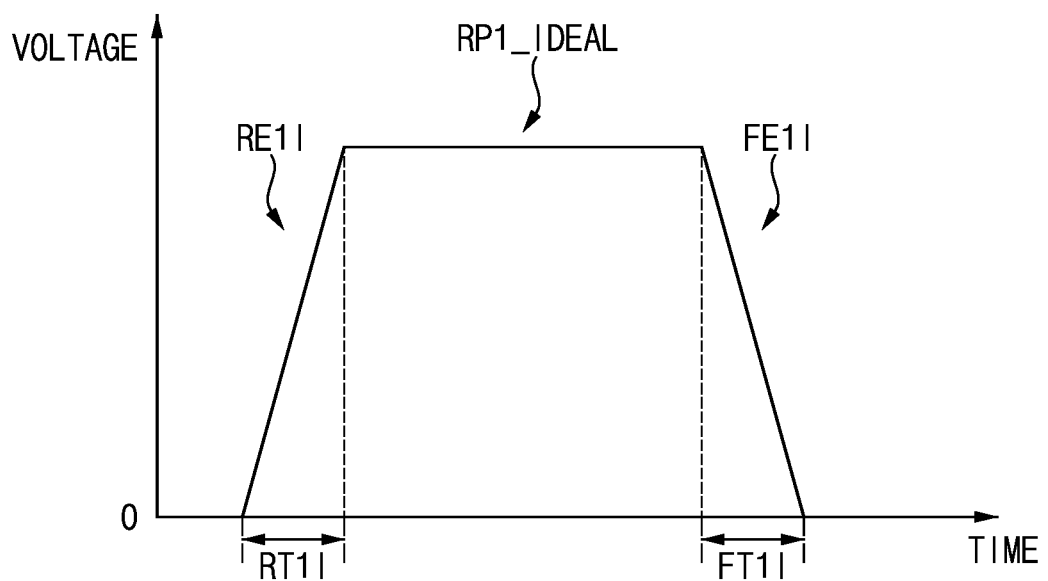
FIGS. 8A, 8B, 8C and 8D illustrate an operation of FIG. 7.

For example, FIG. 8A illustrates an ideal waveform RP1 IDEAL of a read pulse RP1, and the ideal waveform RP1 IDEAL of the read pulse RP1 includes a first edge or a rising edge RE1I, and a second edge or a falling edge FE1I. The rising edge RE1I has a rising time RT1I, and the falling edge FE1I has a falling time FT1I. For example, the rising time RT1I and the falling time FT1I are substantially equal to each other. The read pulse RP1 has a positive read voltage level between the rising edge RE1I and the falling edge FE1I.

Figure 8B:
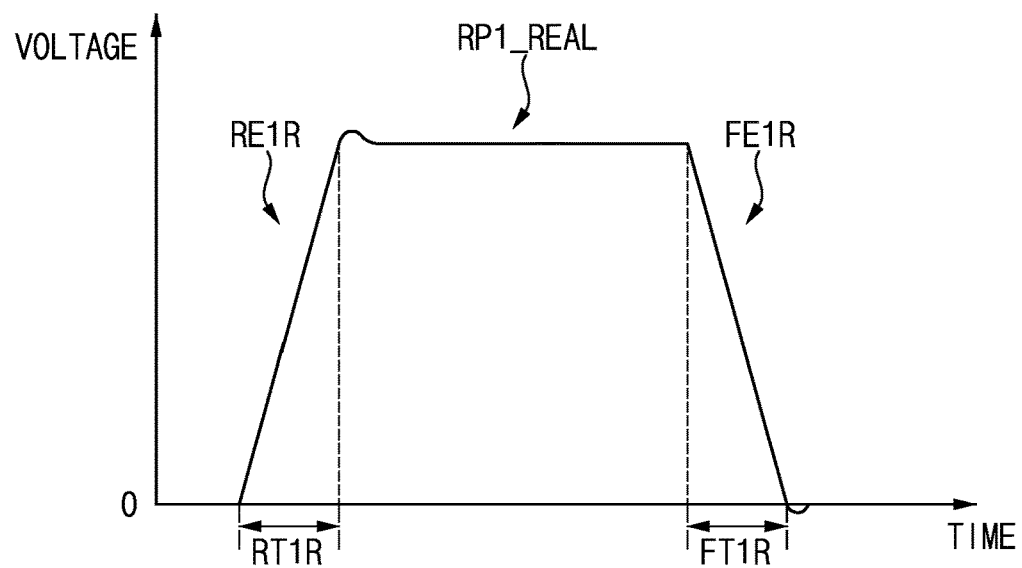

FIG. 8B illustrates a real (or actual) waveform RP1 REAL of the read pulse RP1 when the operation of FIG. 7 is not performed. A rising edge RE1R, a falling edge FE1R, a rising time RT1R and a falling time FT1I in FIG. 8B are substantially the same as or equal to the rising edge RE1I, the falling edge FE1I, the rising time RT1I, and the falling time FT1I in FIG. 8A, respectively. In addition, in FIG. 8B, an overshoot occurs at the end of the rising edge RE1R and an undershoot occurs at the end of the falling edge FE1R.

In the field of signal processing, an overshoot indicates that a signal exceeds its steady state, and an undershoot indicates that a signal falls below its steady state. As illustrated in FIG. 8B, when an overshoot occurs at the end of the rising edge RE1R, the read pulse RP1 increases to a voltage level higher than the positive read voltage level, and then stabilizes at the positive read voltage level. Similarly, when the undershoot occurs at the end of the falling edge FE1R, the read pulse RP1 decreases to a voltage level lower than the zero voltage level, and then stabilizes at the zero voltage level. The overshoot and/or undershoot increases as the transition time of edge, e.g., the rising time of the rising edge and/or the falling time of the falling edge, becomes shorter.

Figure 8C:
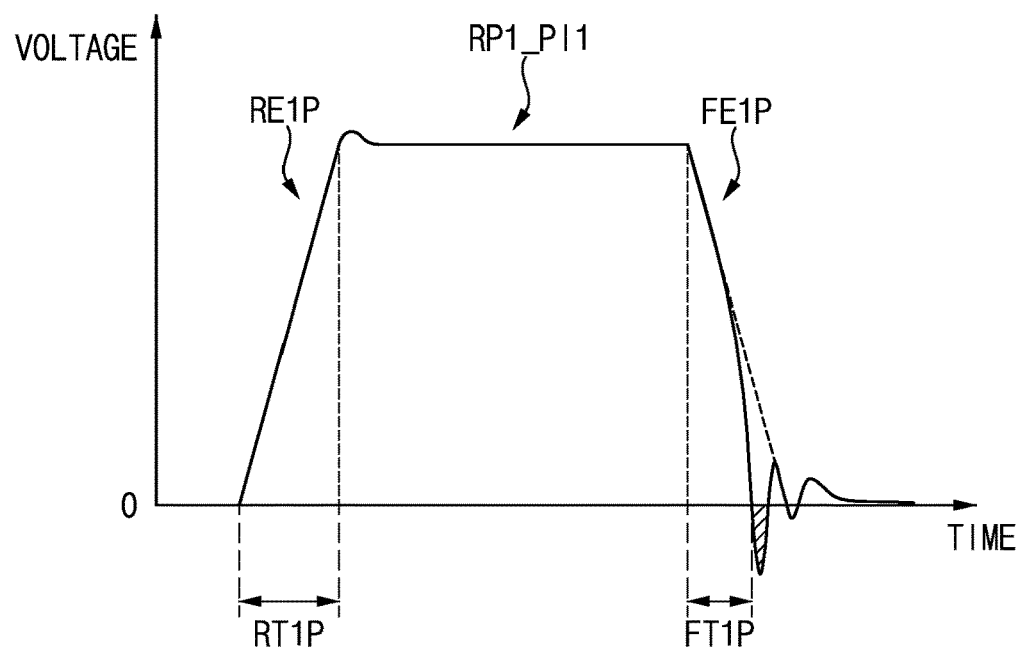

FIG. 8C illustrates a real (or actual) waveform RP1_PI1 of the read pulse RP1 when the operation of FIG. 7 is performed according to embodiments. A rising edge RE1P and a rising time RT1P in FIG. 8C are substantially the same as or equal to the rising edge RE1R and the rising time RT1R in FIG. 8B, respectively, and a falling time FT1P in FIG. 8C is shorter than the falling time FT1R in FIG. 8B. Thus, an absolute value of a slope of the falling edge FE1P in FIG. 8C is greater than an absolute value of the slope of the falling edge FE1R in FIG. 8B. As the falling time FT1P decreases, the undershoot, shown by the hatched region in FIG. 8C, increases on the falling edge FE1P. For example, the undershoot increase indicates that the lowest voltage level of the read pulse becomes lower, that the time for the read pulse to stabilize to the zero voltage level becomes longer, and/or that the area of the hatched region increases. For example, when the read pulse is implemented as described above, the rising time RT1P and the falling time FT1P in FIG. 8C become different from each other.

Figure 8D:
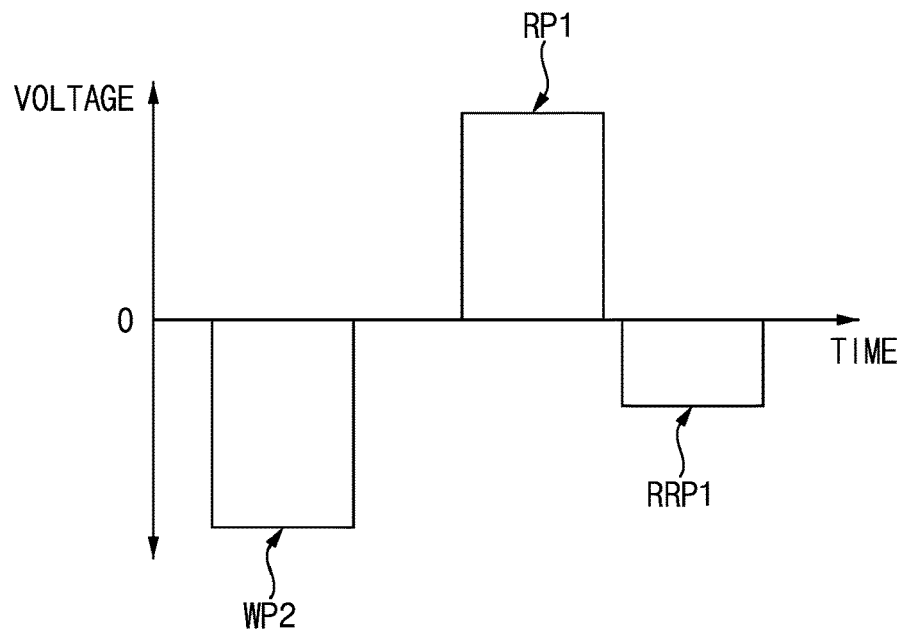

FIG. 8D illustrates a result of applying the read pulse in FIG. 8C to an example of FIG. 5C. The write pulse WP2 and the read pulse RP1 in FIG. 8D are substantially the same as the write pulse WP2 and the read pulse RP1 in FIG. 5C, respectively. As illustrated in FIG. 8C, when the undershoot on the falling edge FE1P increases, the hatched region in FIG. 8C represents a recovery pulse RRP1 that has a polarity opposite to that of the read pulse RP1. Therefore, when the read pulse in FIG. 8C is used in a data read operation, a recovery effect, which is the same as or similar to that of directly generating and applying the recovery pulse RRP1, is implemented without directly generating the recovery pulse RRP1. For example, an absolute value of a negative recovery voltage level of the recovery pulse RRP1 is less than an absolute value of a negative write voltage level of the write pulse WP2, and thus the lowest voltage level of the undershoot occurring at the falling edge FE1P, such as the lowest voltage level of the read pulse, is higher than the negative write voltage level of the write pulse WP2.

Figure 9:
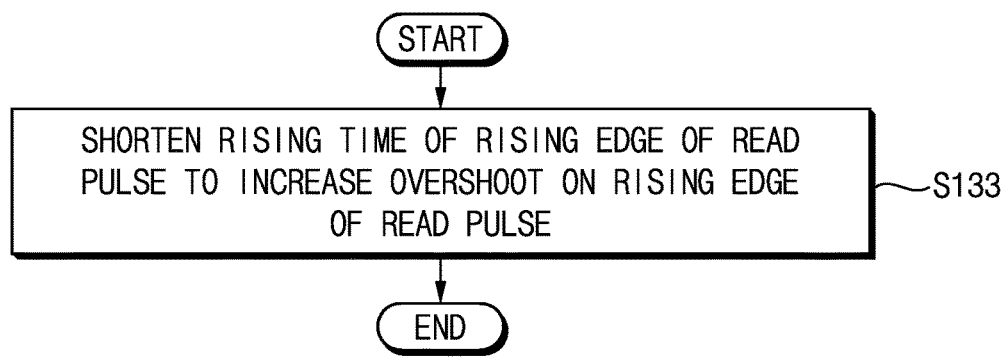
FIG. 9 is a flowchart of adjusting a slope of a second edge of a read pulse in FIG. 6.

FIG. 9 is a flowchart of adjusting a slope of a second edge of a read pulse in FIG. 6. FIGS. 10A, 10B, 10C and 10D illustrates an operation of FIG. 9. Descriptions presented with reference to FIGS. 7, 8A, 8B, 8C and 8D will be omitted.

Referring to FIGS. 5G, 5H, 6, 9, 10A, 10B, 10C and 10D, in an embodiment, an example is illustrated of adjusting the slope of the second edge of the read pulse (step S130). For example, when the write pulse WP1 has a positive polarity, the read pulse RP2 has a negative polarity, and the first edge and the second edge of the read pulse RP2 are a falling edge and a rising edge, respectively. In step S130, a rising time of the rising edge of the read pulse RP2 is shortened to increase an overshoot on the rising edge of the read pulse RP2 (step S133).

Figure 10A:
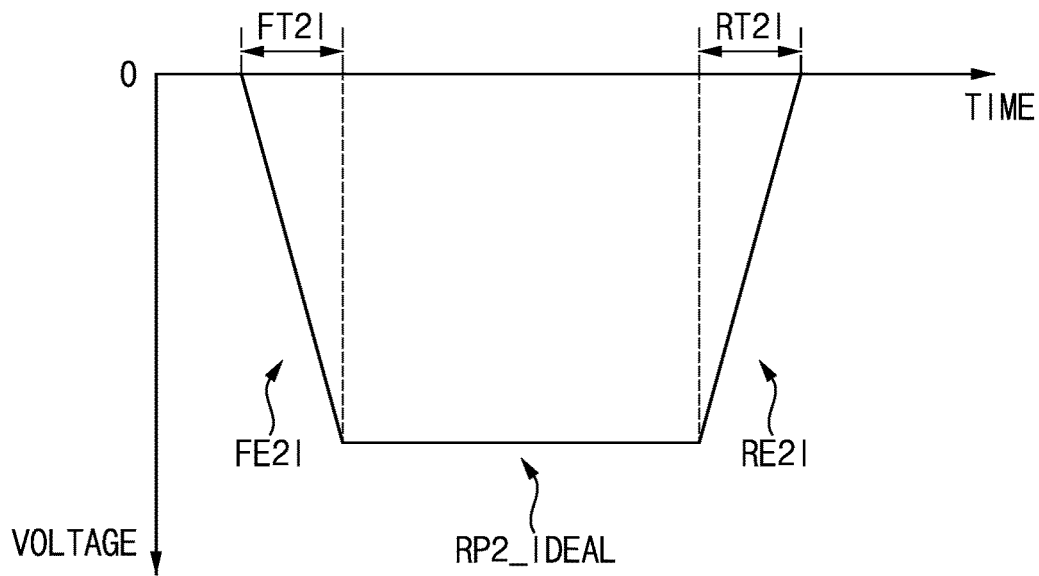
FIGS. 10A, 10B, 10C and 10D illustrate an operation of FIG. 9.

For example, FIG. 10A illustrates an ideal waveform RP2 IDEAL of a read pulse RP2, and the ideal waveform RP2 IDEAL of the read pulse RP2 includes a first edge or a falling edge FE2I, and a second edge or a rising edge RE2I. The falling edge FE2I has a falling time FT2I, and the rising edge RE2I has a rising time RT2I. For example, the falling time FT2I and the rising time RT2I are substantially equal to each other. The read pulse RP2 has a negative read voltage level between the falling edge FE2I and the falling edge FE1I.

Figure 10B:
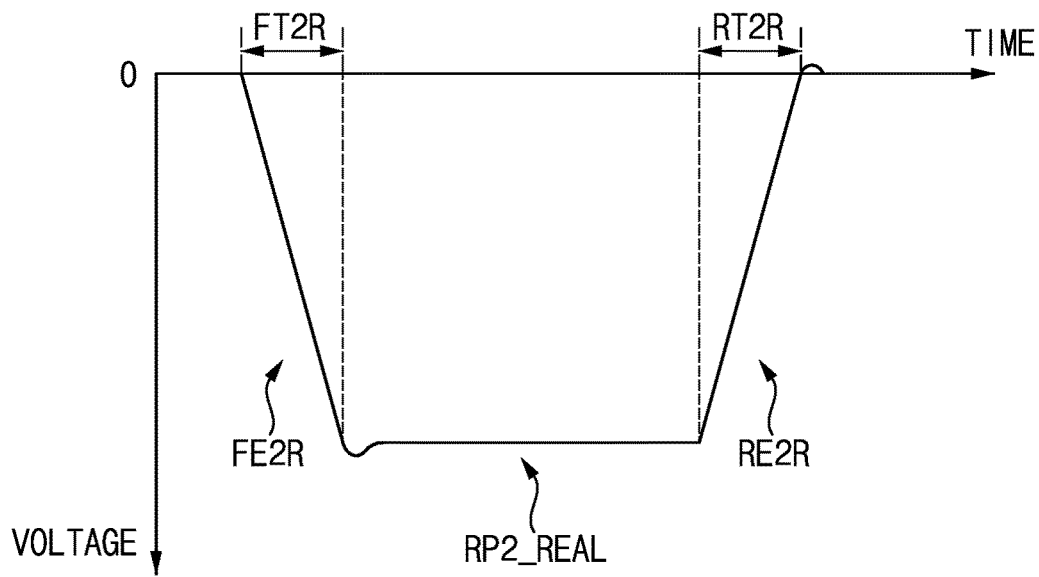

FIG. 10B illustrates a real waveform RP2 REAL of the read pulse RP2 when the operation of FIG. 9 is not performed. A falling edge FE2R, a rising edge RE2R, a falling time FT2R and a rising time RT2R in FIG. 10B are substantially the same as or equal to the falling edge FE2I, the rising edge RE2I, the falling time FT2I and the rising time RT2I in FIG. 10A, respectively. In addition, in FIG. 10B, an undershoot occurs at the end of the falling edge FE2R and an overshoot occurs at the end of the rising edge RE2I.

Figure 10C:
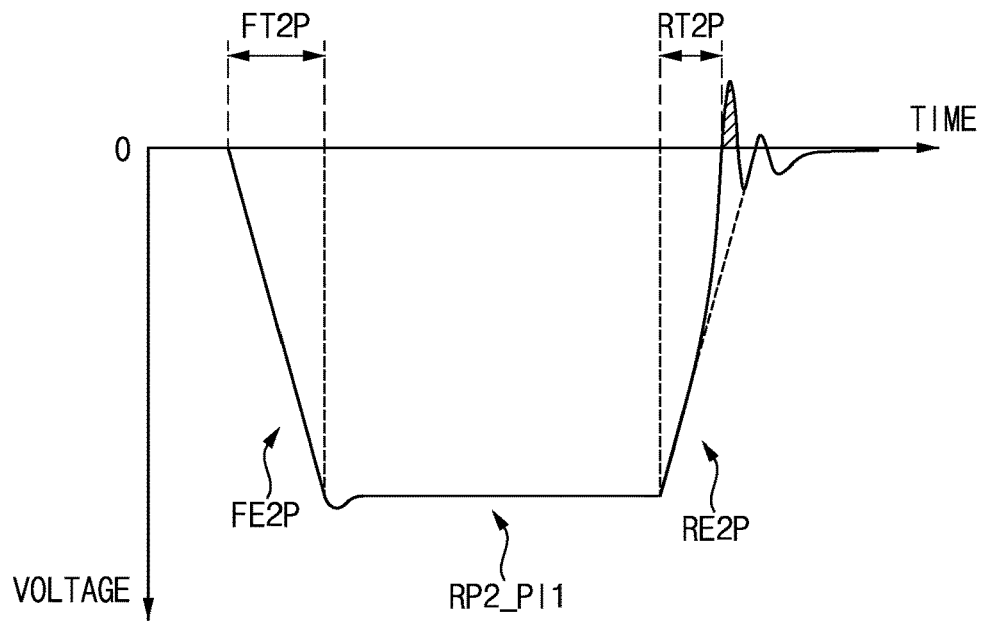

FIG. 10C illustrates a real waveform RP2_PI1 of the read pulse RP2 when the operation of FIG. 9 is performed according to embodiments. A falling edge FE2P and a falling time FT2P in FIG. 10C are substantially the same as or equal to the falling edge FE2R and the falling time FT2R in FIG. 10B, respectively, and a rising time RT2P in FIG. 10C is shorter than the rising time RT2R in FIG. 10B. Thus, an absolute value of a slope of a rising edge RE2P in FIG. 10C is greater than an absolute value of the slope of the rising edge RE2R in FIG. 10B. As the rising time RT2P decreases, the overshoot, represented by the hatched region in FIG. 10C, increases on the rising edge RE2P. For example, the increase in overshoot indicates that the highest voltage level of the read pulse becomes higher, that the time for the read pulse to stabilize to the zero voltage level becomes longer, and/or may that the area of the hatched region increases. For example, when the read pulse is implemented as described above, the falling time FT2P and the rising time RT2P become different from each other.

Figure 10D:
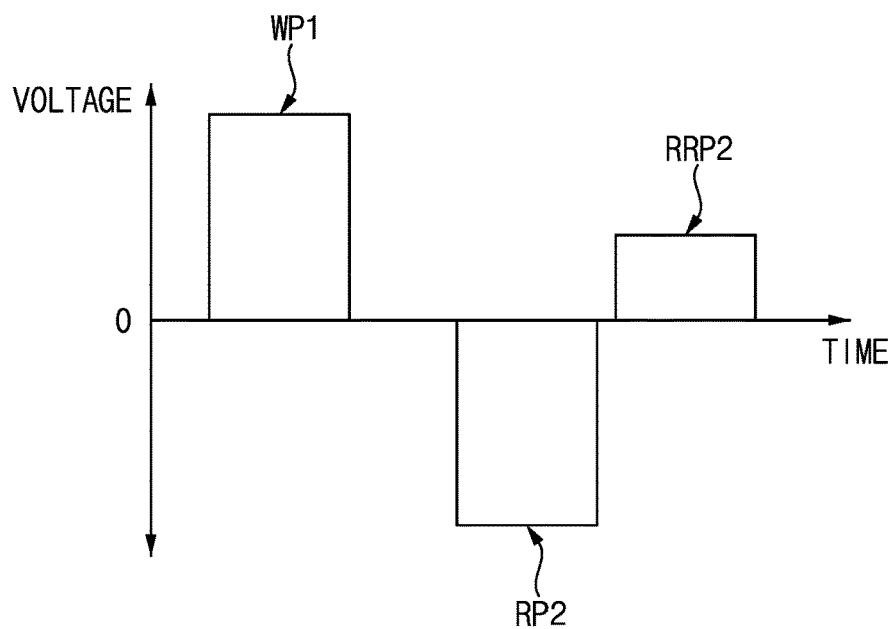

FIG. 10D illustrates a result of applying the read pulse of FIG. 10C to an example of FIG. 5G. The write pulse WP1 and the read pulse RP2 in FIG. 10D are substantially the same as the write pulse WP1 and the read pulse RP2 in FIG. 5G, respectively. As illustrated in FIG. 10C, when the overshoot of the rising edge RE2P increases, the hatched region in FIG. 10C represents a recovery pulse RRP2 that has a polarity opposite to that of the read pulse RP2. Therefore, when the read pulse in FIG. 10C is used in a data read operation, a recovery effect, which is the same as or similar to that of directly generating and applying the recovery pulse RRP2, is implemented without directly generating the recovery pulse RRP2. For example, an absolute value of a positive recovery voltage level of the recovery pulse RRP2 is less than an absolute value of a positive write voltage level of the write pulse WP1, and thus the highest voltage level of the overshoot that occurs on the rising edge RE2P, such as the highest voltage level of the read pulse, is lower than the positive write voltage level of the write pulse WP1.

Figure 11A:
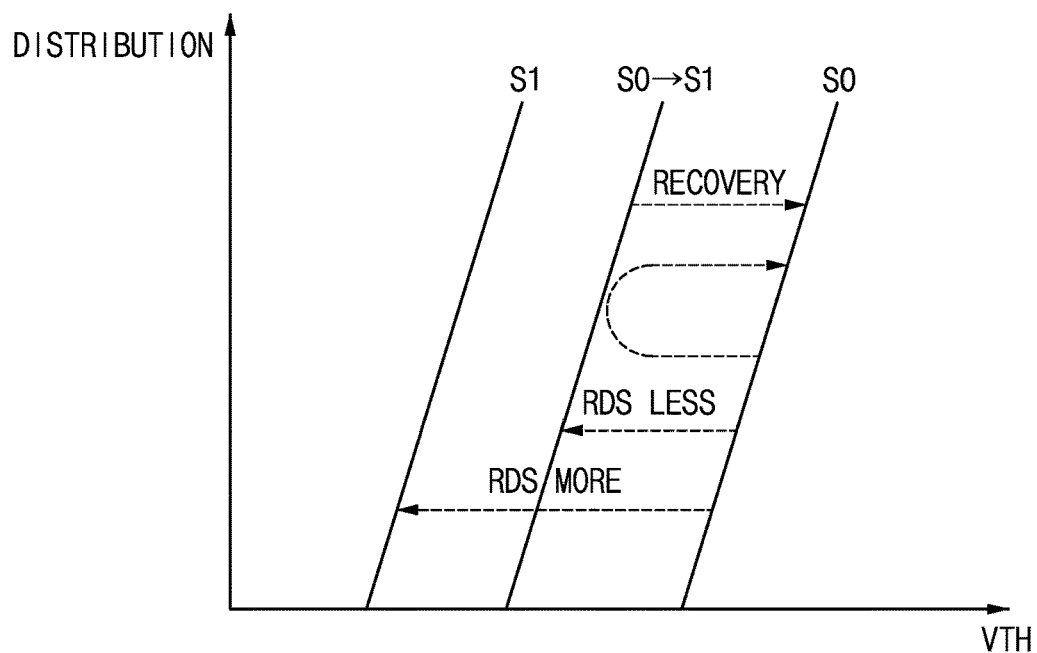
FIGS. 11A and 11B illustrate a method of reading data from a self-selecting memory according to embodiments.
Figure 11B:
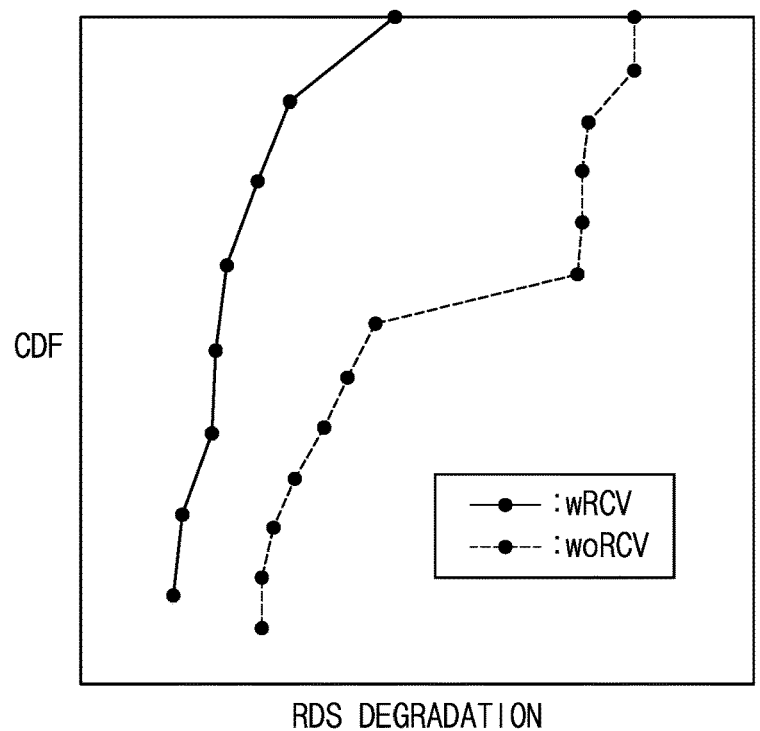

FIGS. 11A and 11B illustrate a method of reading data from a self-selecting memory according to embodiments.

In an embodiment, FIG. 11A illustrates the distribution of different states S0 and S1 according to a threshold voltage VTH of memory cells. For example, when a memory cell is written to have the state S0 and the memory cell is read using a read pulse having an opposite polarity, the memory cell is recovered to the state S0 if the read disturbance RDS is relatively small, but the memory cell might not recover to the state S0 and may change to the state S1 if the read disturbance RDS is relatively large.

According to an embodiment, FIG. 11B illustrates the amount of degradation of the read disturbance RDS as a cumulative distribution function CDF. The reference label "woRCV" represents a case where no recovery pulse is applied, as illustrated in FIGS. 5C and 5G, and the reference label "wRCV" represents a case where the recovery pulse is applied, as illustrated in FIGS. 8C, 8D, 10C and 10D. The graphs show that the amount of degradation of the read disturbance RDS is reduced when the recovery pulse is applied.

A self-selecting memory can have different memory cell threshold voltages between different program states. Programming a memory cell can affect the distribution of various materials in the memory cell the movement of ions in the memory cell, and the threshold voltage of the memory cell. The threshold voltage is related to or represent the logic state of the memory cell. Therefore, a small change in the threshold voltage between the different logic states can affect the accuracy with which the memory cell can be read.

As described above, when a recovery pulse is applied, the change in the threshold voltage can be recovered or restored. In a method of reading data from a self-selecting memory and a self-selecting memory according to embodiments, the slope of the second edge of the read pulse is adjusted to increase the undershoot or overshoot thereof, and thus a recovery effect, which is the same as or similar to that of directly generating and applying the recovery pulse, can be implemented by modifying the read pulse without directly generating the recovery pulse. Accordingly, the read disturbance effect is efficiently resolved while preventing an increase in design complexity and chip size.

Figure 12:
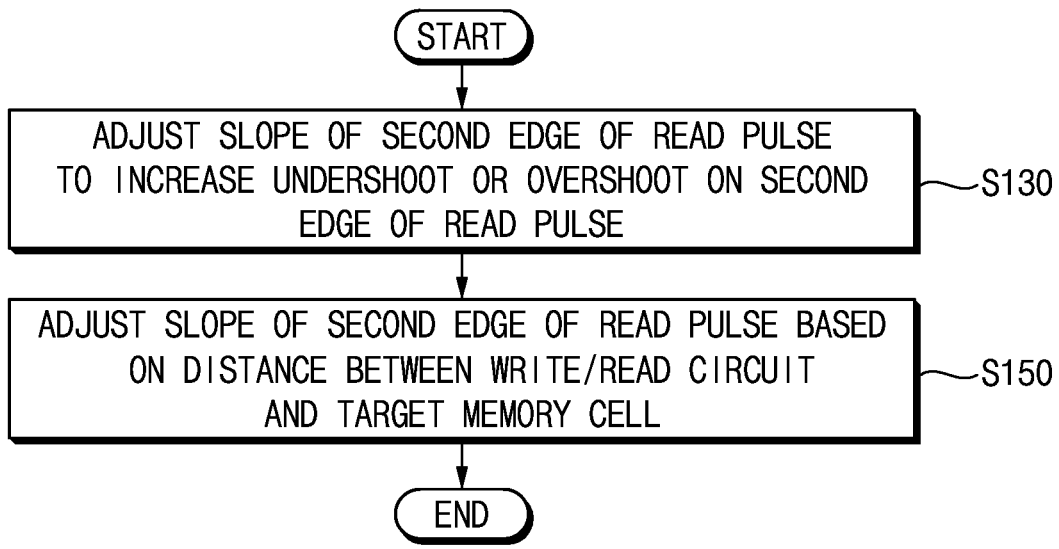
FIG. 12 is a flowchart of generating a read pulse in FIG. 1.

FIG. 12 is a flowchart of generating a read pulse in FIG. 1. Descriptions presented with reference to FIG. 6 will be omitted.

Referring to FIGS. 1 and 12, in an embodiment, when generating a read pulse that has a polarity opposite to that of a write pulse (step S100), step S130 in FIG. 12 is substantially the same as step S130 in FIG. 6.

The slope of the second edge of the read pulse is adjusted based on a distance between a write/read circuit that provides the read pulse and the target memory cell (step S150). For example, depending on the distance between the write/ read circuit and the target memory cell, the adjustment amount, such as the decreasing amount, of the transition time of the second edge of the read pulse is differently set.

Figure 13:
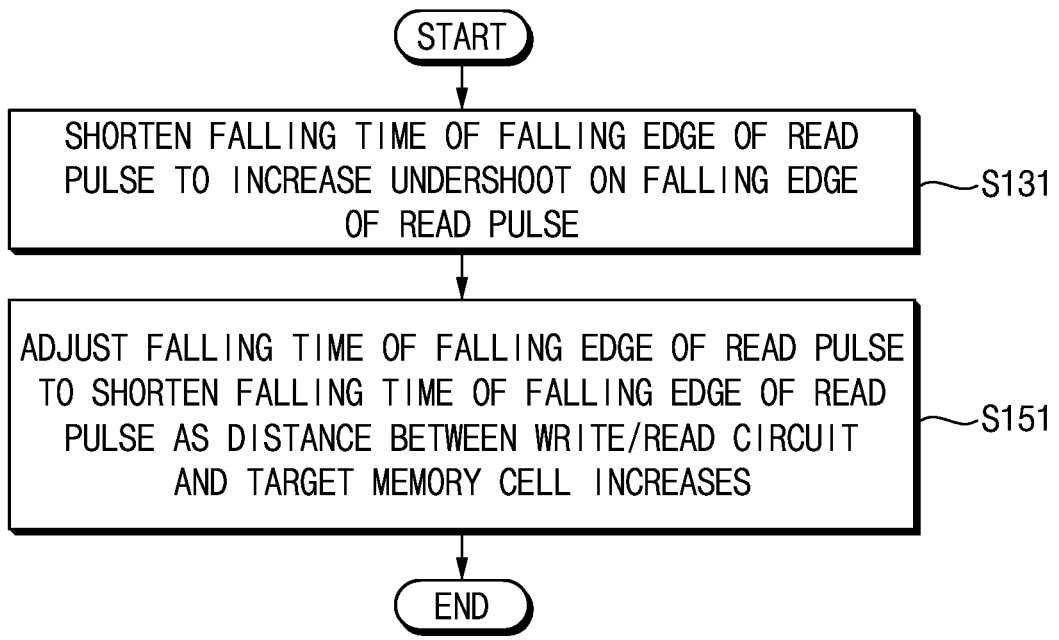
FIG. 13 is a flowchart of adjusting a slope of a second edge of a read pulse in FIG. 12.
Figure 14A:
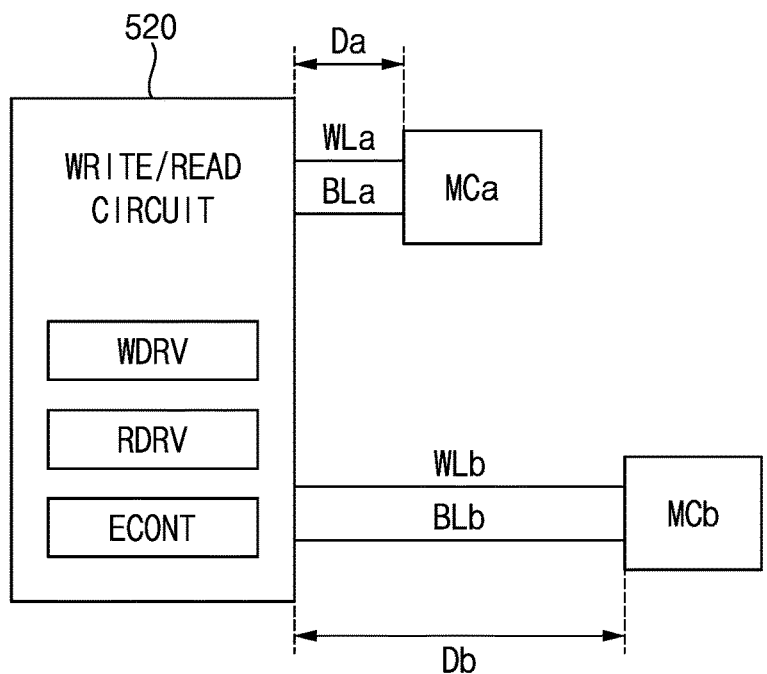
FIGS. 14A, 14B and 14C illustrate an operation of FIG. 13.
Figure 14B:
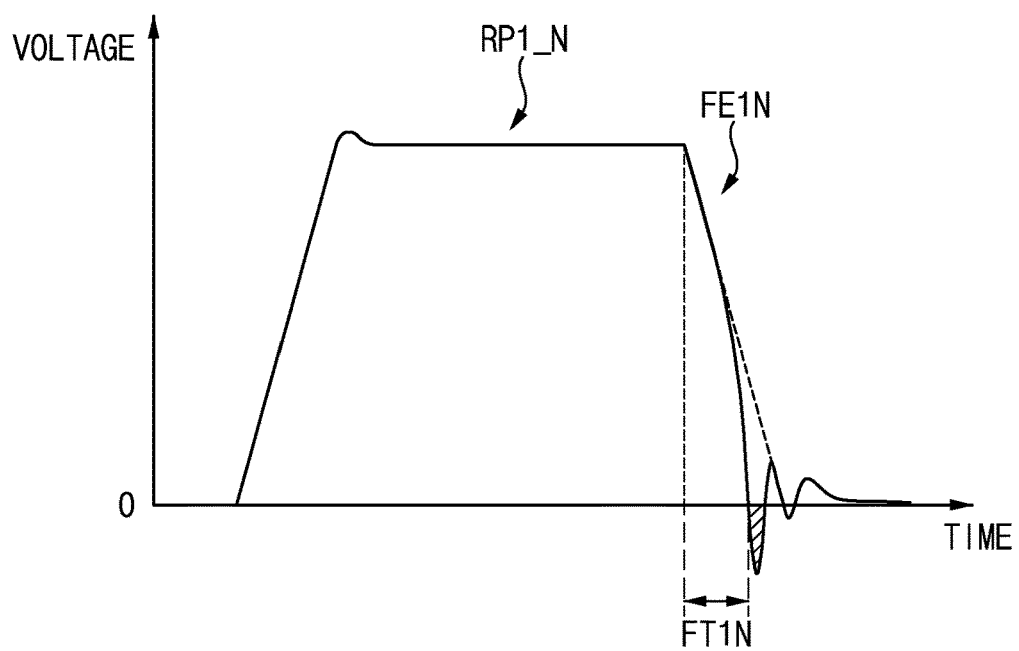
Figure 14C:
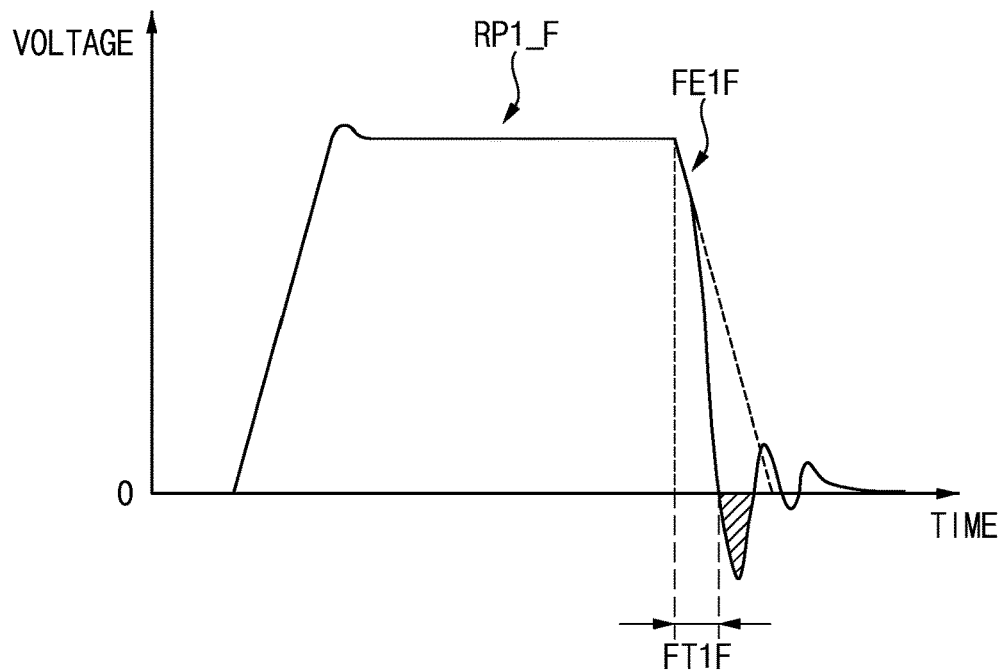

FIG. 13 is a flowchart of adjusting a slope of a second edge of a read pulse in FIG. 12. FIGS. 14A, 14B and 14C illustrate an operation of FIG. 13. Descriptions presented with reference to FIGS. 7, 8A, 8B, 8C and 8D will be omitted.

Referring to FIGS. 12, 13, 14A, 14B and 14C, in an embodiment, when adjusting the slope of the second edge of the read pulse (step S130), step S131 in FIG. 13 is substantially the same as step S131 in FIG. 7.

When adjusting the slope of the second edge of the read pulse (step S150), the falling time of the falling edge of the read pulse is adjusted to shorten the falling time of the falling edge of the read pulse as the distance between the write/read circuit and the target memory cell increases (step S151). For example, as the distance between the write/read circuit and the target memory cell increases, the undershoot on the falling edge of the read pulse increases.

For example, as illustrated in FIG. 14A, in an embodiment, a self-selecting memory cell MCa is connected to the write/read circuit 520 through a wordline WLa and a bitline BLa, and a self-selecting memory cell MCb is connected to the write/read circuit 520 through the wordline WLb and the bitline BLb. A distance Db between the write/read circuit 520 and the self-selecting memory cell MCb is greater than a distance Da between the write/read circuit 520 and the self-selecting memory cell MCa. The self-selecting memory cell MCa with the shorter distance Da may be referred to as a near-cell, and the self-selecting memory cell MCb with the longer distance Db may be referred to as a far-cell.

FIG. 14B illustrates a real waveform RP1_N of a read pulse RP1 when the operation of FIG. 13 is performed on the near-cell MCa, according to embodiments. A falling edge FE1N, a falling time FT1N and an undershoot, represented by the hatched region, on the falling edge FE1N in FIG. 14B are substantially the same as or equal to the falling edge FE1P, the falling time FT1P and the undershoot, represented by the hatched region, on the falling edge FE1P in FIG. 8C, respectively.

FIG. 14C illustrates a real waveform RP1_F of the read pulse RP1 when the operation of FIG. 13 is performed on the far-cell MCb, according to embodiments. A falling time FT1F in FIG. 14C is shorter than the falling time FT1N in FIG. 14B, and thus an absolute value of the slope of the falling edge FE1F in FIG. 14C is greater than an absolute value of the slope of the falling edge FE1N in FIG. 14B. As the falling time FT1F decreases, an undershoot, represented by the hatched region, increases on the falling edge FE1F. For example, as the distance from the write/read circuit 520 increases, the parasitic resistance increases and the undershoot effect decreases. Thus, the undershoot effect increases or is maximized by shortening the falling time of the falling edge as the distance from the write/read circuit 520 increases.

Figure 15:
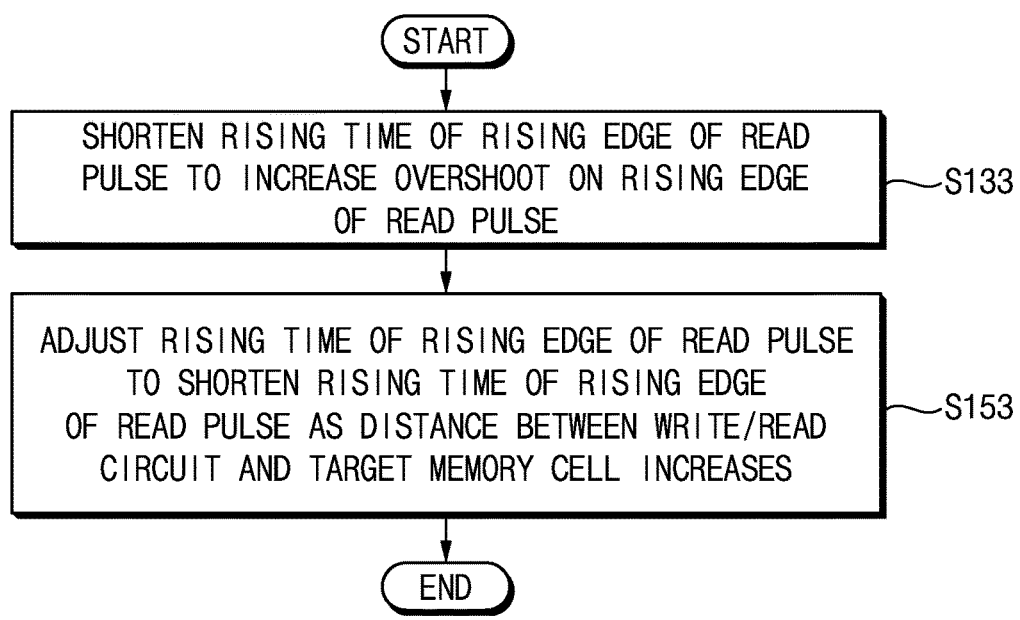
FIG. 15 is a flowchart of adjusting a slope of a second edge of a read pulse in FIG. 12.
Figure 16A:
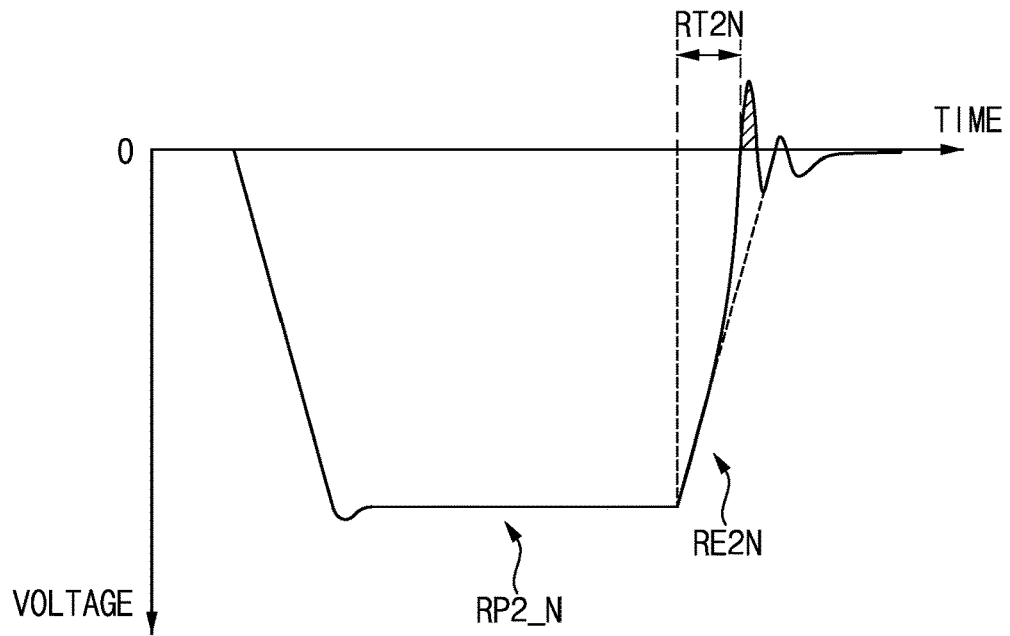
FIGS. 16A and 16B illustrate an operation of FIG. 15.
Figure 16B:
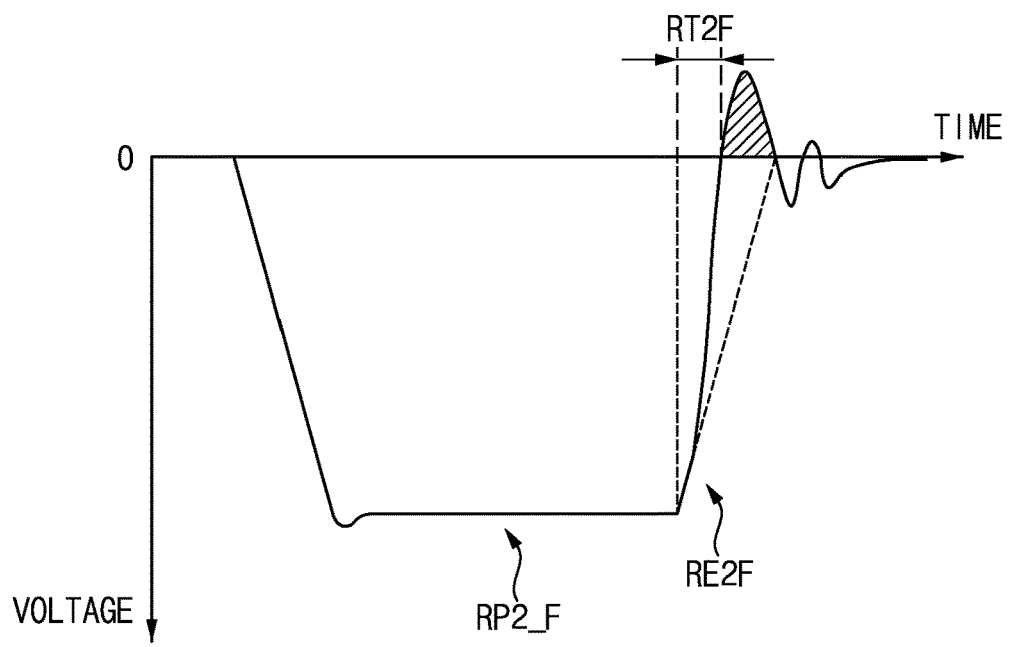

FIG. 15 is a flowchart of adjusting a slope of a second edge of a read pulse in FIG. 12. FIGS. 16A and 16B illustrate an operation of FIG. 15. Descriptions presented with reference to FIGS. 9, 10A, 10B, 10C, 10D, 13, 14A, 14B and 14C will be omitted.

Referring to FIGS. 12, 14A, 15, 16A and 16B, in an embodiment, when adjusting the slope of the second edge of a read pulse (step S130), step S133 in FIG. 15 is substantially the same as step S133 in FIG. 9.

When adjusting the slope of the second edge of the read pulse (step S150), the rising time of the rising edge of the read pulse is adjusted to shorten the rising time of the rising edge of the read pulse as the distance between the write/read circuit and the target memory cell increases (step S153). For example, as the distance between the write/read circuit and the target memory cell increases, the overshoot on the rising edge of the read pulse increase.

For example, FIG. 16A illustrates a real waveform RP2_N of the read pulse RP2 when the operation of FIG. 15 is performed on the near-cell MCa, according to embodiments. A rising edge RE2N, a rising time RT2N and an overshoot, represented by the hatched region, on the rising edge RE2N in FIG. 16A are substantially the same as or equal to the rising edge RE2N, the rising time RT2N and the overshoot, represented by the hatched region, on the rising edge RE2N in FIG. 10C, respectively.

FIG. 16B illustrates a real waveform RP2_F of the read pulse RP2 when the operation of FIG. 15 is performed on the far-cell MCb, according to embodiments. A rising time RT2F in FIG. 16B is shorter than the rising time RT2N in FIG. 16A, and thus an absolute value of the slope of the rising edge RE2F in FIG. 16B is greater than an absolute value of the slope of the rising edge RE2N in FIG. 16A. As the rising time RT2F decreases, an overshoot, represented by hatched region, increases on the rising edge RE2F. For example, as the distance from the write/read circuit 520 increases, the parasitic resistance increases and the overshoot effect decreases. Thus, the overshoot effect increases or is maximized by shortening the rising time of the rising edge as the distance from the write/read circuit 520 increases.

Figure 17:
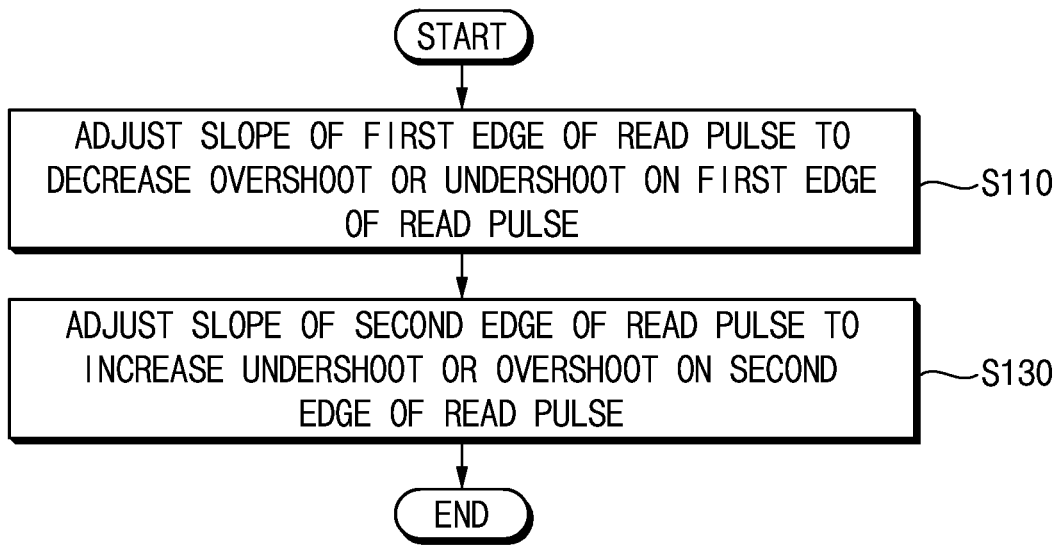
FIG. 17 is a flowchart of generating a read pulse in FIG. 1.

FIG. 17 is a flowchart of generating a read pulse in FIG. 1. Descriptions presented with reference to FIG. 6 will be omitted.

Referring to FIGS. 1 and 17, in an embodiment, when generating a read pulse having a polarity opposite to that of a write pulse (step S100), the slope of the first edge of the read pulse is additionally adjusted to decrease the overshoot or undershoot on the first edge that represents the starting point of the read pulse (step S110). For example, the slope of the first edge of the read pulse is adjusted, (e.g., by decreasing an absolute value of the slope, by adjusting, e.g., increasing, a transition time of the first edge of the read pulse.

Thereafter, step S130 in FIG. 17 is substantially the same as step S130 in FIG. 6.

Figure 18:
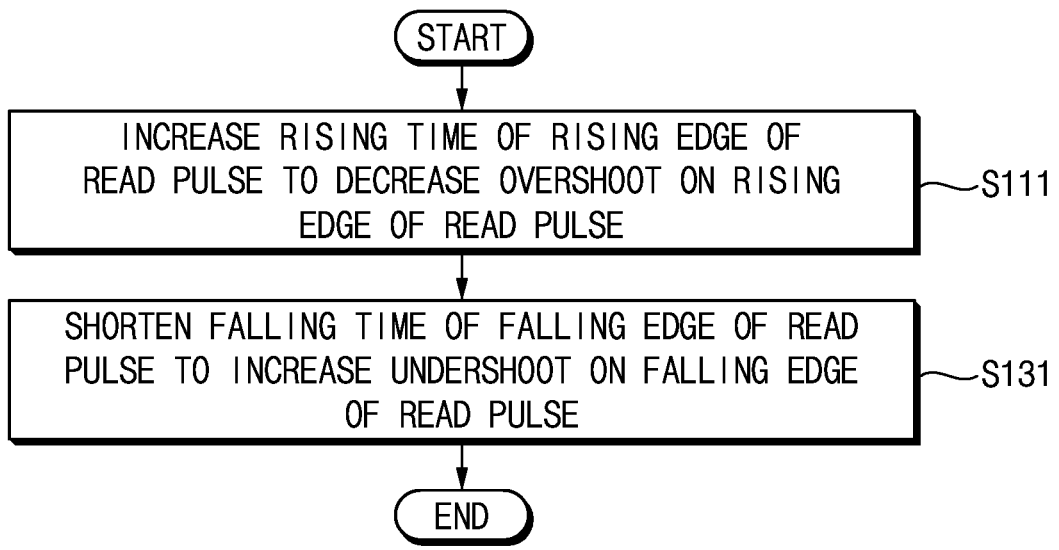
FIG. 18 is a flowchart of adjusting slopes of first and second edges of a read pulse in FIG. 17.
Figure 19:
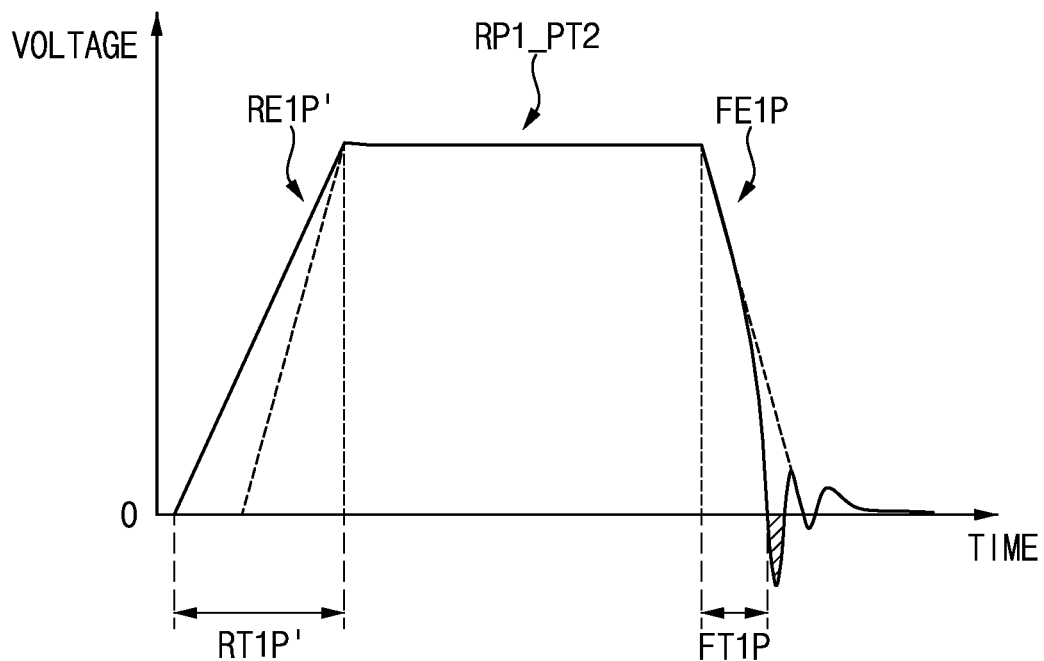
FIG. 19 illustrates an operation of FIG. 18.

FIG. 18 is a flowchart of adjusting slopes of first and second edges of a read pulse in FIG. 17. FIG. 19 illustrates an operation of FIG. 18. Descriptions presented with reference to FIGS. 7, 8A, 8B, 8C and 8D will be omitted.

According to an embodiment, FIGS. 5C, 5D, 17, 18 and 19 illustrate an example of additionally adjusting the slope of the first edge of the read pulse (step S110). For example, when a write pulse WP2 has a negative polarity, the read pulse RP1 has a positive polarity, and the first edge and the second edge of the read pulse RP1 are a rising edge and a falling edge, respectively. In step S110, a rising time of the rising edge of the read pulse RP1 is increased to decrease an overshoot on the rising edge of the read pulse RP1 (step S111).

Thereafter, step S131 in FIG. 18 is substantially the same as step S131 in FIG. 7.

For example, FIG. 19 illustrates a real waveform RP1_PI2 of the read pulse RP1 when the operation of FIG. 18 is performed according to embodiments. A falling edge FE1P and a falling time FT1P in FIG. 19 are substantially the same as or equal to the falling edge FE1P and the falling time FT1P in FIG. 8C, respectively, and a rising time RT1P' in FIG. 19 is longer than the rising time RT1P in FIG. 8C. Thus, an absolute value of a slope of a rising edge RE1P' in FIG. 19 is less than an absolute value of the slope of the rising edge RE1P in FIG. 8C. As the rising time RT1P' increases, the overshoot decreases on the rising edge RE1P'. For example, when the read pulse is implemented as described above, the rising time RT1P' and the falling time FT1P become different from each other.

Figure 20:
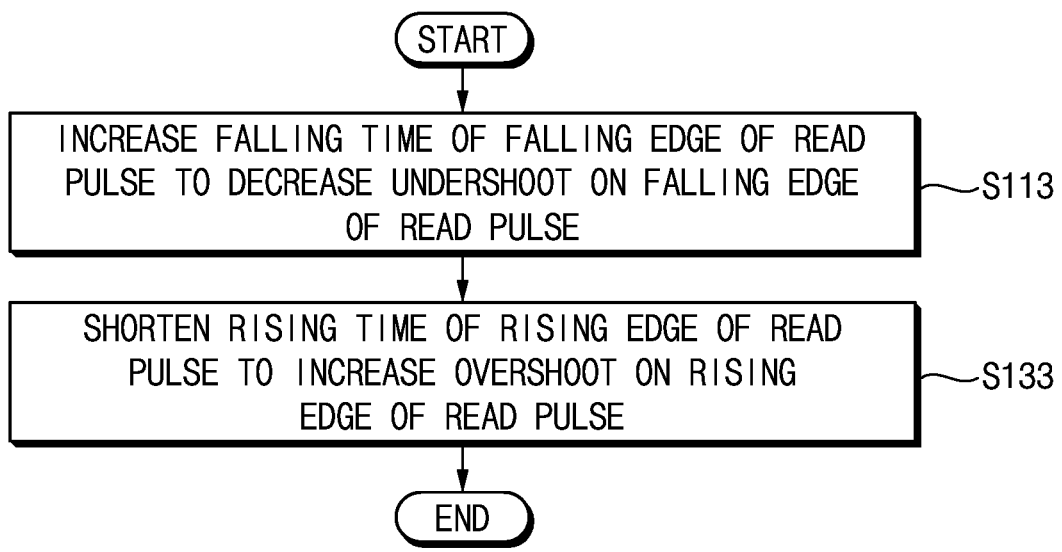
FIG. 20 is a flowchart of adjusting slopes of first and second edges of a read pulse in FIG. 17.
Figure 21:
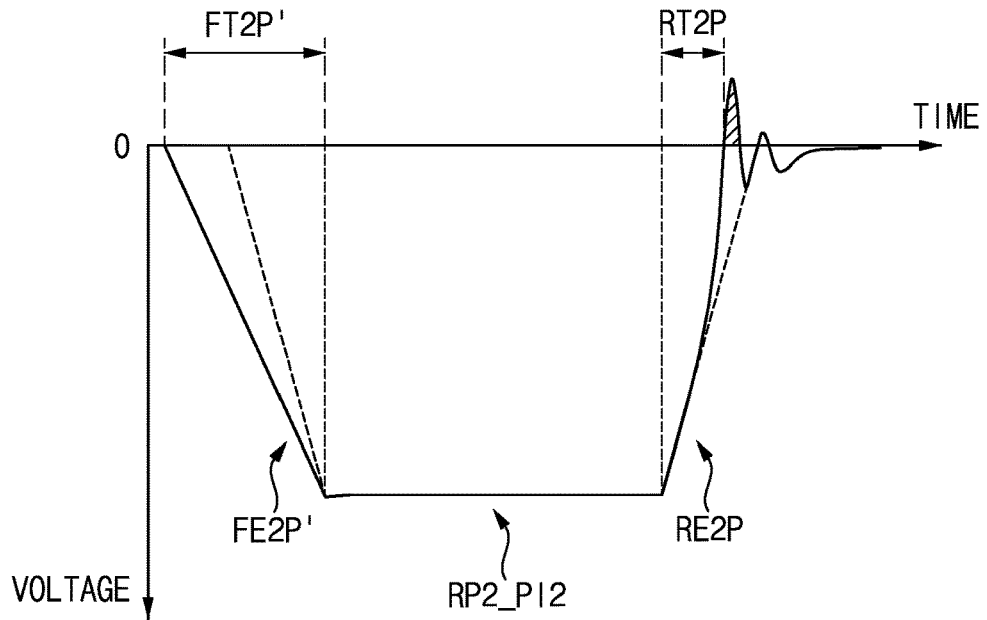
FIG. 21 illustrates an operation of FIG. 20.

FIG. 20 is a flowchart of adjusting slopes of first and second edges of a read pulse in FIG. 17. FIG. 21 illustrates an operation of FIG. 20. Descriptions presented with reference to FIGS. 9, 10A, 10B, 10C, 10D, 18 and 19 will be omitted.

According to an embodiment, FIGS. 5G, 5H, 17, 20 and 21 illustrate an example of additionally adjusting the slope of the first edge of the read pulse (step S110). For example, when a write pulse WP1 has a positive polarity, the read pulse RP2 has a negative polarity, and the first edge and the second edge of the read pulse RP2 are a falling edge and a rising edge, respectively. In step S110, a falling time of the falling edge of the read pulse RP1 increases to decrease an undershoot on the falling edge of the read pulse RP1 (step S113).

Thereafter, step S133 in FIG. 20 is substantially the same as step S133 in FIG. 9.

For example, FIG. 21 illustrates a real waveform RP2_PI2 of the read pulse RP2 when the operation of FIG. 20 is performed according to embodiments. A rising edge RE2P and a rising time RT2P in FIG. 21 are substantially the same as or equal to the rising edge RE2P and the rising time RT2P in FIG. 10C, respectively, and a falling time FT2P' in FIG. 21 is longer than the falling time FT2P in FIG. 10C. Thus, an absolute value of a slope of a falling edge FE2P' in FIG. 21 is less than an absolute value of the slope of the falling edge FE2P in FIG. 10C. As the falling time FT2P' increases, the undershoot decrease on the falling edge FE2P'. For example, when the read pulse is implemented as described above, the falling time FT2P' and the rising time RT2P become different from each other.

In a method of reading data from a self-selecting memory and a self-selecting memory according to embodiments, the slope of the first edge of the read pulse is additionally adjusted to decrease the overshoot or undershoot on the first edge of the read pulse, and thus the read stress is reduced. Accordingly, the read disturbance effect is efficiently resolved while preventing an increase in design complexity and chip size.

Figure 22:
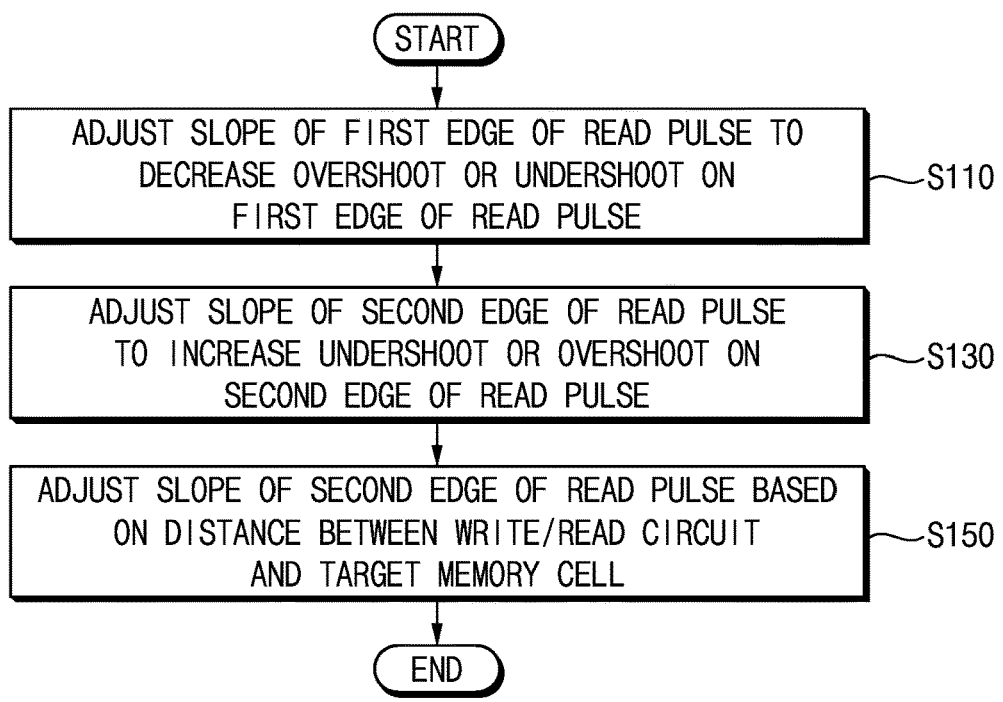
FIG. 22 is a flowchart of generating a read pulse in FIG. 1.

FIG. 22 is a flowchart of generating a read pulse in FIG. 1. Descriptions presented with reference to FIGS. 6, 12 and 17 will be omitted.

Referring to FIGS. 1 and 22, in an embodiment, when generating a read pulse that has a polarity opposite to that of a write pulse (step S100), steps S110, S130 and S150 in FIG. 22 are substantially the same as step S110 in FIG. 17, step S130 in FIG. 2 and step S150 in FIG. 12, respectively.

FIGS. 23A, 23B, 23C, 23D and 23E illustrate a method of reading data from a self-selecting memory according to embodiments.

Figure 23A:
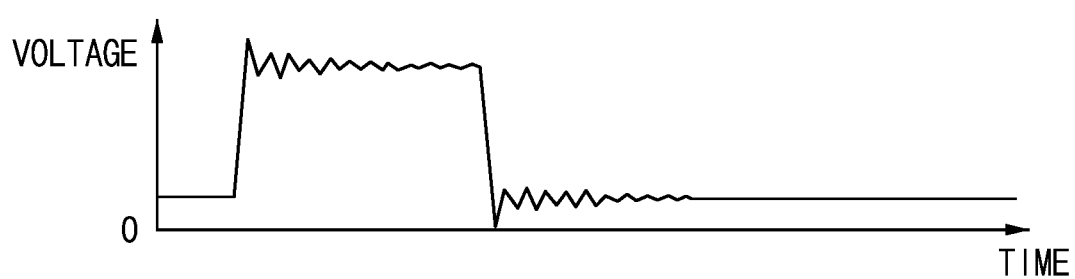
FIGS. 23A, 23B, 23C, 23D and 23E illustrate a method of reading data from a self-selecting memory according to embodiments.
Figure 23B:
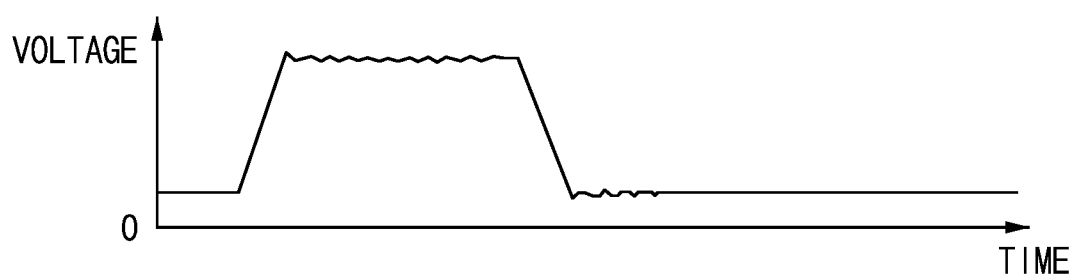
Figure 23C:
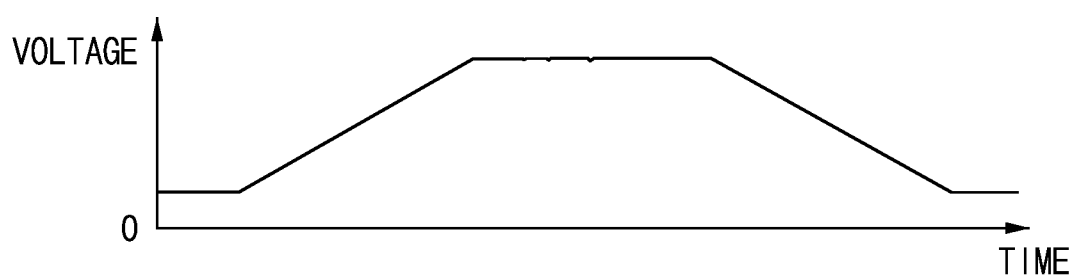

According to an embodiment, FIGS. 23A, 23B and 23C illustrate examples where the read pulse has a positive polarity. In FIGS. 23A, 23B and 23C, the rising time of the rising edge and the falling time of the falling edge are set differently from each other. For example, in the read pulse of FIG. 23A, each of the rising time and the falling time is set to a first time. In the read pulse of FIG. 23B, each of the rising time and the falling time is set to a second time longer than the first time. In the read pulse of FIG. 23C, each of the rising time and the falling time is set to a third time longer than the second time. For example, the first time, the second time and the third time are about 20 ns, 100 ns and 500 ns, respectively. The overshoot on the rising edge and the undershoot on the falling edge increases as the rising and fall times become shorter.

Figure 23D:
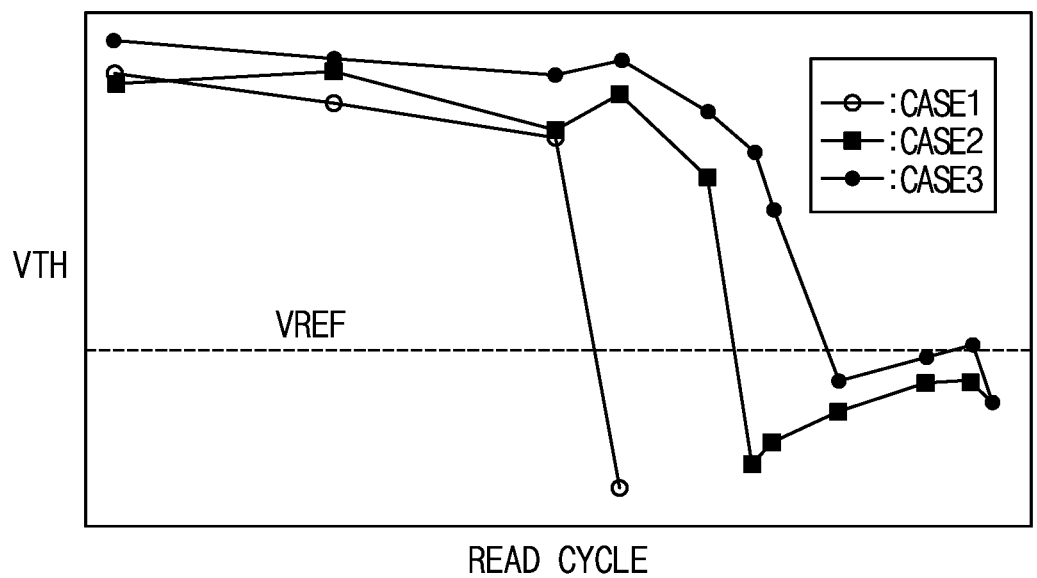
Figure 23E:
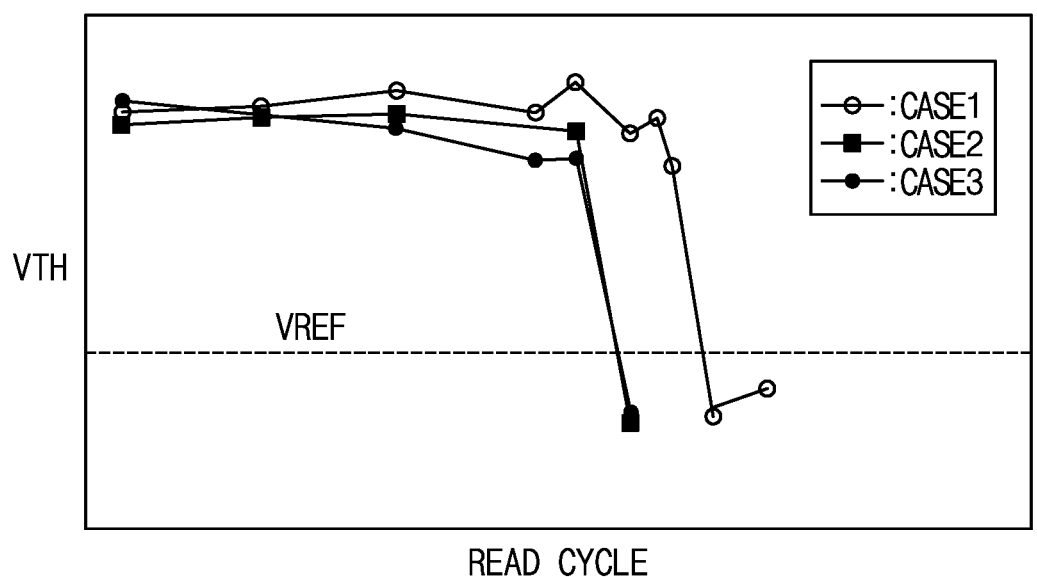

According to an embodiment, FIGS. 23D and 23E illustrate the changes in the threshold voltage VTH when the data read operation is repeatedly performed using a read pulse that has a polarity opposite to that of the write pulse after the data write operation is performed using the write pulse. When the threshold voltage VTH is higher than a reference voltage VREF, the state of the memory cell is maintained. When the threshold voltage VTH is lower than the reference voltage VREF, the state of the memory cell changes due to the read disturbance effect. In FIGS. 23D and 23E, CASE1, CASE2 and CASE3 represent the read pulse in FIG. 23A, the read pulse in FIG. 23B and the read pulse in FIG. 23C, respectively.

FIG. 23D shows that the read disturbance effect is reduced when the overshoot on the rising edge is controlled by adjusting only the rising time. In CASE1, the state of the memory cell changes due to the read disturbance effect when the data read operation is repeated a first number of times, such as when the number of read cycles is equal to a first number. In CASE2, the state of the memory cell changes due to the read disturbance effect when the data read operation is repeated a second number of times greater than the first number of times, such as when the number of read cycles is equal to a second number greater than the first number. In CASE3, the state of the memory cell changes due to the read disturbance effect when the data read operation is repeated a third number of times greater than the second number of times, such as when the number of read cycles is equal to a third number greater than the second number. Thus, the read disturbance effect is reduced as the overshoot decreases on the rising edge.

FIG. 23E shows that the read disturbance effect is reduced when the undershoot on the falling edge is controlled by adjusting only the falling time. In CASE1, the state of the memory cell changes due to the read disturbance effect when the data read operation is repeated a fourth number of times, such as when the number of read cycles is equal to a fourth number. In CASE2 and CASE3, the state of the memory cell changes due to the read disturbance effect when the data read operation is repeated a fifth number of times less than the fourth number of times, such as when the number of read cycles is equal to a fifth number less than the fourth number. Thus, the read disturbance effect is reduced as the undershoot increases on the falling edge.

Figure 24:
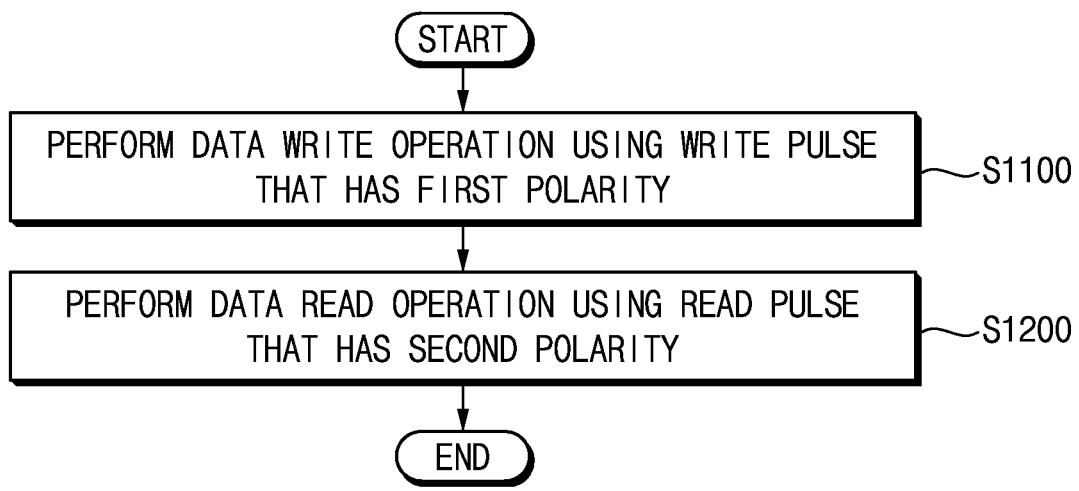
FIG. 24 is a flowchart of operating a self-selecting memory according to embodiments.

FIG. 24 is a flowchart of a method of operating a self-selecting memory according to embodiments.

Referring to FIG. 24, a method of operating a self-selecting memory according to embodiments is performed by a self-selecting memory that includes a self-selecting memory cell array and a write/read circuit. The self-selecting memory has a configuration described with reference to FIG. 2.

In a method of operating a self-selecting memory according to embodiments, a data write operation is performed on a target memory cell in the self-selecting memory using a write pulse that has a first polarity (step S1100). For example, a write pulse is generated that hays the first polarity, and the write pulse is applied to the target memory cell. For example, step S1100 is performed by a write driver in the write/read circuit, such as the write driver WDRV in the write/read circuit 520 of FIG. 2, and is performed based on a write command and a write address received from an external memory controller.

A data read operation is performed on the target memory cell using a read pulse that has a second polarity opposite to the first polarity (step S1200). For example, step S1200 is performed based on a method of reading data from a self-selecting memory according to embodiments described with reference to FIGS. 1 through 23. Accordingly, a read disturbance effect is efficiently resolved while preventing an increase in design complexity and chip size.

In some embodiments, the data write operation is implemented with double polarities or bi-directional polarity, and the data read operation is implemented with a single polarity or uni-directional polarity. For example, the write pulse used in the data write operation has both a positive polarity and a negative polarity, and the read pulse used in the data read operation is fixed to one of a positive polarity or a negative polarity.

FIG. 25 is a block diagram of a memory system that includes a self-selecting memory according to embodiments.

Referring to FIG. 25, in an embodiment, a memory system 10 includes a memory controller 20 and a self-selecting memory (SSM) 40. The memory system 10 furthers include a plurality of signal lines 30 that electrically connect the memory controller 20 with the self-selecting memory 40.

The self-selecting memory 40 is controlled by the memory controller 20. For example, based on requests from a host device, the memory controller 20 stores e.g., writes or programs, data into the self-selecting memory 40, or retrieves, e.g., reads or senses, data from the self-selecting memory 40.

The plurality of signal lines 30 include control lines, command lines, address lines, data input/output (I/O) lines and power lines. The memory controller 20 transmits a command CMD, an address ADDR and a control signal CTRL to the self-selecting memory 40 via the command lines, the address lines and the control lines, respectively, exchanges data DAT with the self-selecting memory 40 via the data I/O lines, and transmits a power supply voltage PWR to the self-selecting memory 40 via the power lines.

The self-selecting memory 40 includes a self-selecting memory cell array (SSMCA) 41 and a write/read circuit (WRC) 43. The self-selecting memory 40 is a self-selecting memory according to embodiments, and performs a method of reading data from the self-selecting memory and a method of operating the self-selecting memory according to embodiments described with reference to FIGS. 1 through 24.

In some embodiments, at least a part or all of the signal lines 30 may be referred to as a channel. The term "channel" as used herein represents signal lines that include the data I/O lines that transmit the data DAT. However, embodiments are not necessarily limited thereto, and in other embodiments, the channel further includes the command lines that transmit the command CMD and/or the address lines that transmit the address ADDR.

Figure 26:
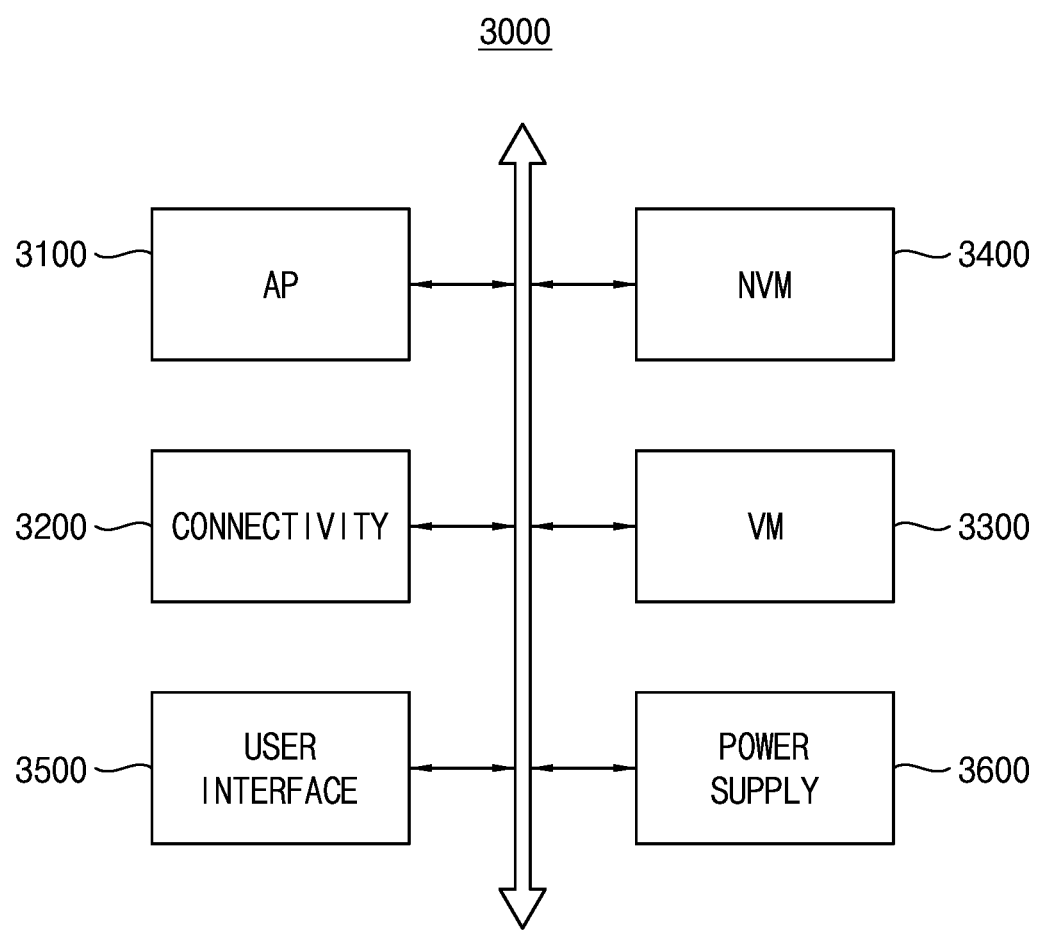
FIG. 26 is a block diagram of an electronic system according to embodiments.

FIG. 26 is a block diagram of an electronic system according to embodiments.

Referring to FIG. 26, in an embodiment, an electronic system 3000 includes an application processor (AP) 3100, a connectivity unit 3200, a volatile memory (VM) device 3300, a nonvolatile memory (NVM) device 3400, a user interface unit 3500 and a power supply unit 3600 connected via a bus. For example, the electronic system 3000 is a mobile system.

The application processor 3100 executes applications such as a web browser, a game application, a video player, etc. The connectivity unit 3200 performs wired or wireless communication with an external device.

The volatile memory device 3300 stores data processed by the application processor 3100, or operates as a working memory. The nonvolatile memory device 3400 stores a boot image that boots the electronic system 3000 and other data. The user interface unit 3500 includes at least one input device, such as a keypad, a touch screen, etc., and/or at least one output device, such as a speaker, a display device, etc. The power supply unit 3600 supplies a power supply voltage to the electronic system 3000. In some embodiments, the electronic system 3000 further includes a camera image processor (CIS), and/or a storage device, such as one or more of a memory card, a solid state drive (SSD), a hard disk drive (HDD), a compact disc read only memory (CD-ROM), etc.

The nonvolatile memory device 3400 includes a self-selecting memory according to embodiments, and performs a method of reading data from the self-selecting memory and a method of operating the self-selecting memory according to embodiments described with reference to FIGS. 1 through 24.

Embodiments of the inventive concept can be incorporated into various electronic devices and systems that include self-selecting memories. For example, embodiments of the inventive concept can be incorporated into systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

The foregoing is illustrative of embodiments and is not to be construed as limiting thereof. Although some embodiments have been described, those skilled in the art will readily appreciate that many modifications are possible in the embodiments without materially departing from the novel teachings and advantages of the embodiments. Accordingly, all such modifications are intended to be included within the scope of the embodiments as defined in the claims. Therefore, it is to be understood that the foregoing is illustrative of various embodiments and is not to be construed as limited to the specific embodiments disclosed, and that modifications to disclosed embodiments, as well as other embodiments, are intended to be included within the scope of the appended claims.

What is claimed is:

1. A method of reading data from a self-selecting memory, the method comprising:
  generating a read pulse that has a polarity opposite to that of a write pulse, wherein the write pulse writes data into a target memory cell in the self-selecting memory, wherein the read pulse has a first edge that is a starting point of the read pulse and a second edge that is an ending point of the read pulse;
  adjusting a slope of the second edge of the read pulse wherein an undershoot or overshoot of the second edge of the read pulse increases; and
  applying the read pulse to the target memory cell.

2. The method of claim 1, wherein, when the write pulse has a negative polarity, the read pulse has a positive polarity, and the second edge of the read pulse is a falling edge.

3. The method of claim 2, further comprising increasing an undershoot on the falling edge of the read pulse by decreasing a falling time of the falling edge of the read pulse.

4. The method of claim 3, further comprising shortening the falling time of the falling edge of the read pulse as a distance between a write/read circuit that generates the read pulse and the target memory cell increases.

5. The method of claim 1, wherein, when the write pulse has a positive polarity, the read pulse has a negative polarity, and the second edge of the read pulse is a rising edge.

6. The method of claim 5, further comprising increasing an overshoot on the rising edge of the read pulse by decreasing a rising time of the rising edge of the read pulse.

7. The method of claim 6, further comprising shortening the rising time of the rising edge of the read pulse as a distance between a write/read circuit that generates the read pulse and the target memory cell increases.

8. The method of claim 1, further comprising decreasing an overshoot or undershoot on the first edge of the read pulse by adjusting a slope of the first edge of the read pulse.

9. The method of claim 8, wherein, when the write pulse has a negative polarity, the read pulse has a positive polarity, and the first edge of the read pulse is a rising edge.

10. The method of claim 9, further comprising decreasing overshoot on the rising edge of the read pulse by increasing a rising time of the rising edge of the read pulse.

11. The method of claim 8, wherein, when the write pulse has a positive polarity, the read pulse has a negative polarity, and the first edge of the read pulse is a falling edge.

12. The method of claim 11, further comprising decreasing an undershoot on the falling edge of the read pulse by increasing a falling time of the falling edge of the read pulse.

13. The method of claim 1, wherein the read pulse is fixed to one of a positive polarity or a negative polarity.

14. The method of claim 13, wherein the write pulse has both the positive polarity and the negative polarity.

15. The method of claim 1, wherein the target memory cell includes:
a first electrode connected to a bitline;
a second electrode connected to a wordline; and
a self-selecting material disposed between the first electrode and the second electrode.

16. The method of claim 15, wherein the self-selecting material includes a chalcogenide material.

17. The method of claim 15, wherein the target memory cell does not include a switching element.

18. A self-selecting memory, comprising:
a self-selecting memory cell array that includes a plurality of self-selecting memory cells; and
a write/read circuit that controls a data write operation and a data read operation on the self-selecting memory cell array,
wherein, in the data read operation on a target memory cell in the self-selecting memory cell array, the write/read circuit generates a read pulse that has a polarity opposite to that of a write pulse and applies the read pulse to the target memory cell, wherein the write pulse writes data into the target memory cell,
wherein the read pulse has a first edge that is a starting point of the read pulse and a second edge that is an ending point of the read pulse, and
wherein a slope of the second edge of the read pulse is adjusted wherein an undershoot or overshoot on the second edge of the read pulse increases.

19. The self-selecting memory of claim 18, wherein the write/read circuit includes:
a write driver that generates the write pulse;
a read driver that generates the read pulse; and
an edge controller that adjusts the slope of the second edge of the read pulse.

20. A method of operating a self-selecting memory, the method comprising:
performing a data write operation on a target memory cell in the self-selecting memory by using a write pulse that has a first polarity; and
performing a data read operation on the target memory cell by using a read pulse that has a second polarity opposite to the first polarity,
wherein performing the data read operation includes:
generating the read pulse; and
applying the read pulse to the target memory cell,
wherein generating the read pulse includes:
adjusting a slope of a first edge of the read pulse by increasing a transition time of the first edge of the read pulse wherein an overshoot or undershoot of the first edge decreases, wherein the first edge is a starting point of the read pulse;
adjusting a slope of a second edge of the read pulse by decreasing a transition time of the second edge of the read pulse wherein an undershoot or overshoot of the second edge increases, wherein the second edge is an ending point of the read pulse; and
adjusting the slope of the second edge of the read pulse such that the transition time of the second edge of the read pulse becomes shorter as a distance between a write/read circuit that generates the read pulse and the target memory cell increases, and
wherein, in response to adjusting the slopes of the first and second edges of the read pulse, the transition times of the first and second edges of the read pulse become different from each other.

* * * * *